US012796285B2

(12) United States Patent
Liu et al.

(10) Patent No.: US 12,796,285 B2
(45) Date of Patent: Nov. 10, 2026

(54) ORGANIC LIGHT EMITTING DIODE DISPLAY SUBSTRATE AND ORGANIC LIGHT EMITTING DIODE DISPLAY APPARATUS

(71) Applicants: Hefei Xinsheng Optoelectronics Technology Co., Ltd., Hefei (CN); BOE Technology Group Co., Ltd., Beijing (CN)

(72) Inventors: Ning Liu, Beijing (CN); Bin Zhou, Beijing (CN); Can Yuan, Beijing (CN); Yu Wang, Beijing (CN); Xinxin Wang, Beijing (CN); Dacheng Zhang, Beijing (CN)

(73) Assignees: Hefei Xinsheng Optoelectronics Technology Co., Ltd., Hefei (CN); Beijing BOE Technology Development Co., Ltd., Beijing (CN)

( * ) Notice: Subject to any disclaimer, the term of this patent is extended or adjusted under 35 U.S.C. 154(b) by 517 days.

(21) Appl. No.: 18/027,928

(22) PCT Filed: Jun. 29, 2022

(86) PCT No.: PCT/CN2022/102447

§ 371 (c)(1),
(2) Date: Mar. 23, 2023

(87) PCT Pub. No.: WO2024/000297

PCT Pub. Date: Jan. 4, 2024

(65) Prior Publication Data

US 2024/0324396 A1 Sep. 26, 2024

(51) Int. Cl.

*H10K 59/80* (2023.01)
*H10K 59/122* (2023.01)
*H10K 102/00* (2023.01)

(52) U.S. Cl.

CPC ..... *H10K 59/80522* (2023.02); *H10K 59/122* (2023.02); *H10K 59/873* (2023.02); *H10K 2102/351* (2023.02)

(58) Field of Classification Search

CPC ........... H10K 59/80522; H10K 59/122; H10K 59/873; H10K 2102/351; H10K 59/80517

See application file for complete search history.

(56) References Cited

U.S. PATENT DOCUMENTS

2016/0013438 A1 1/2016 Im et al.
2022/0037616 A1 2/2022 Liu et al.
(Continued)

FOREIGN PATENT DOCUMENTS

CN 103137891 A 6/2013
CN 105261632 A 1/2016
(Continued)

OTHER PUBLICATIONS

Liu; Gao-bo, CN-111969034-A, Machine Translation (Year: 2020).*

*Primary Examiner* — Jacob Y Choi
*Assistant Examiner* — Grace Cha

(57) ABSTRACT

The present disclosure provides a display substrate and a display apparatus. The display substrate includes a drive structure layer disposed on a base substrate and a light emitting structure layer disposed on the drive structure layer, the light emitting structure layer at least includes a cathode and an auxiliary electrode, and the cathode is connected with the auxiliary electrode; the auxiliary electrode includes a first auxiliary electrode, a second auxiliary electrode, and a third auxiliary electrode stacked along a direction away from the base substrate, the third auxiliary electrode has a protruding portion relative to a sidewall of the second auxiliary electrode, a protruding distance of the protruding portion is greater than or equal to a thickness of the second auxiliary electrode, and the protruding distance is a distance between
(Continued)

an edge of the third auxiliary electrode and the sidewall of the second auxiliary electrode.

19 Claims, 7 Drawing Sheets

(56) References Cited

U.S. PATENT DOCUMENTS

| | | | | |
|---|---|---|---|---|
| 2022/0075469 | A1 | 3/2022 | Xia et al. | |
| 2022/0093894 | A1* | 3/2022 | Song .................. | H10K 59/1201 |
| 2022/0255038 | A1 | 8/2022 | Wang et al. | |
| 2023/0123248 | A1 | 4/2023 | Wu et al. | |
| 2023/0189570 | A1 | 6/2023 | Lin | |

FOREIGN PATENT DOCUMENTS

| | | | | | |
|---|---|---|---|---|---|
| CN | 109360900 | A | | 2/2019 | |
| CN | 111864116 | A | | 10/2020 | |
| CN | 111969034 | A | * | 11/2020 | ............. H10K 71/00 |
| CN | 112068732 | A | | 12/2020 | |
| CN | 112103326 | A | | 12/2020 | |
| CN | 112952023 | A | | 6/2021 | |
| CN | 112993183 | A | | 6/2021 | |
| CN | 113013357 | A | | 6/2021 | |
| CN | 113270426 | A | | 8/2021 | |
| CN | 113488514 | A | | 10/2021 | |

* cited by examiner

ORGANIC LIGHT EMITTING DIODE DISPLAY SUBSTRATE AND ORGANIC LIGHT EMITTING DIODE DISPLAY APPARATUS

CROSS-REFERENCE TO RELATED APPLICATION

The present application is a U.S. National Phase Entry of International Application No. PCT/CN2022/102447 having an international filing date of Jun. 29, 2022. The entire contents of the above-identified application are hereby incorporated by reference.

TECHNICAL FIELD

The present disclosure relates to, but is not limited to, the field of display technologies, and more particularly, to a display substrate and a display apparatus.

BACKGROUND

An Organic Light Emitting Diode (OLED) and a Quantum dot Light Emitting Diode (QLED) are active light emitting display devices, and have advantages of self-luminescence, a wide viewing angle, a high contrast ratio, low power consumption, an extremely high response speed, lightness and thinness, bendability, and a low cost, etc. With continuous development of display technologies, a display apparatus that uses an OLED or a QLED as a light emitting device and uses a Thin Film Transistor (TFT) for signal control has become a mainstream product in the field of display at present.

SUMMARY

The following is a summary of subject matters described herein in detail. The summary is not intended to limit the protection scope of claims.

In one aspect, the present disclosure provides a display substrate including a drive structure layer disposed on a base substrate and a light emitting structure layer disposed on one side of the drive structure layer away from the base substrate, the light emitting structure layer at least includes a cathode and an auxiliary electrode, and the cathode is connected with the auxiliary electrode; the auxiliary electrode includes a first auxiliary electrode, a second auxiliary electrode, and a third auxiliary electrode stacked along a direction away from the base substrate, the third auxiliary electrode has a protruding portion relative to a sidewall of the second auxiliary electrode, and the protruding portion and the sidewall of the second auxiliary electrode form an inwardly recessed structure, a protruding distance of the protruding portion is greater than or equal to a thickness of the second auxiliary electrode, and the protruding distance is a distance between an edge of the third auxiliary electrode and the sidewall of the second auxiliary electrode.

In an exemplary implementation mode, the protruding distance is 1.0 to 2.5 times the thickness of the second auxiliary electrode.

In an exemplary implementation mode, a thickness of the third auxiliary electrode is greater than a thickness of the cathode.

In an exemplary implementation mode, the light emitting structure layer further includes an organic emitting layer, the organic emitting layer is connected with the cathode, and the protruding distance is 1 to 2 times a thickness of the organic emitting layer.

In an exemplary implementation mode, the thickness of the second auxiliary electrode is greater than the thickness of the organic emitting layer.

In an exemplary implementation mode, the display substrate further includes a first encapsulation layer disposed on one side of the light emitting structure layer away from the base substrate, the first encapsulation layer wraps the auxiliary electrode, a ratio of a thickness of the third auxiliary electrode to the thickness of the organic emitting layer has a first ratio, and a ratio of the thickness of the second auxiliary electrode to a thickness of the first encapsulation layer has a second ratio, and the first ratio is greater than the second ratio.

In an exemplary implementation mode, on a plane parallel to the base substrate, a width of the second auxiliary electrode is less than a width of the first auxiliary electrode, and an orthographic projection of the second auxiliary electrode on the base substrate is within a range of an orthographic projection of the first auxiliary electrode on the base substrate; the width of the second auxiliary electrode is less than a width of the third auxiliary electrode, and the orthographic projection of the second auxiliary electrode on the base substrate is within a range of an orthographic projection of the third auxiliary electrode on the base substrate; the width of the third auxiliary electrode is less than the width of the first auxiliary electrode, and the orthographic projection of the third auxiliary electrode on the base substrate is within the range of the orthographic projection of the first auxiliary electrode on the base substrate.

In an exemplary implementation mode, on a plane perpendicular to the display substrate, a cross section of the second auxiliary electrode is in a shape of a trapezoid.

In an exemplary implementation mode, the drive structure layer includes a first conductive layer, a first insulation layer, a semiconductor layer, a second insulation layer, a second conductive layer, a third insulation layer, a third conductive layer, a fourth insulation layer, and a planarization layer disposed sequentially on the base substrate, the first conductive layer at least includes a barrier electrode, the semiconductor layer at least includes an active layer, the second conductive layer at least includes a gate electrode, the third conductive layer at least includes a source electrode, a drain electrode, and a power supply electrode, and the first auxiliary electrode in the auxiliary electrode is connected with the power supply electrode through a via.

In an exemplary implementation mode, the light emitting structure layer further includes an anode, the anode includes a first anode, a second anode, and a third anode stacked along the direction away from the base substrate, an orthographic projection of the second anode on the base substrate is within a range of an orthographic projection of the first anode on the base substrate, and the orthographic projection of the second anode on the base substrate is within a range of an orthographic projection of the third anode on the base substrate.

In an exemplary implementation mode, the first auxiliary electrode and the first anode are disposed in a same layer and are made of a same material; the second auxiliary electrode and the second anode are disposed in a same layer and are made of a same material; the third auxiliary electrode and the third anode are disposed in a same layer and are made of a same material.

In an exemplary implementation mode, the light emitting structure layer further includes a pixel definition layer, a pixel opening and an auxiliary electrode opening are provided on the pixel definition layer, the pixel opening exposes a surface of the third anode in the anode, and the auxiliary electrode opening exposes a whole surface of the third auxiliary electrode and a portion of a surface of the first auxiliary electrode in the auxiliary electrode.

In an exemplary implementation mode, orthographic projections of the second auxiliary electrode and the third auxiliary electrode on the base substrate are within a range of an orthographic projection of the auxiliary electrode opening on the base substrate.

In an exemplary implementation mode, within the auxiliary electrode opening, the cathode laps over a surface of the first auxiliary electrode on a side away from the base substrate.

In an exemplary implementation mode, there is a first lapping distance between the cathode and the surface of the first auxiliary electrode on the side away from the base substrate, and the protruding distance is less than the first lapping distance.

In an exemplary implementation mode, the light emitting structure layer further includes an organic emitting layer, the organic emitting layer laps over the surface of the first auxiliary electrode on the side away from the base substrate, there is the first lapping distance between an edge of the organic emitting layer close to the second auxiliary electrode and the sidewall of the second auxiliary electrode.

In an exemplary implementation mode, the protruding portion is in a shape of an arc drooping towards a direction of the base substrate, and a minimum distance between an edge of the protruding portion on a side close to the organic emitting layer and an edge of the organic emitting layer on a side close to the protruding portion is greater than a thickness of the third auxiliary electrode.

In an exemplary implementation mode, within the auxiliary electrode opening, the cathode laps over the sidewall of the second auxiliary electrode.

In an exemplary implementation mode, there is a second lapping distance between the cathode and the sidewall of the second auxiliary electrode, and the protruding distance is greater than the second lapping distance.

In an exemplary implementation mode, the light emitting structure layer further includes an organic emitting layer, a light emitting block, and a cathode block, the organic emitting layer is connected with the third anode, the cathode is connected with the organic emitting layer, the light emitting block is disposed on a surface of the third auxiliary electrode on a side away from the base substrate, the light emitting block and the organic emitting layer are isolated from each other, the cathode block is disposed on a surface of the light emitting block on a side away from the base substrate, and the cathode block and the cathode are isolated from each other.

In another aspect, the present disclosure also provides a display apparatus including the aforementioned display substrate.

Other aspects may become apparent after accompanying drawings and detailed description are read and understood.

BRIEF DESCRIPTION OF DRAWINGS

The accompanying drawings are intended to provide an understanding of technical solutions of the present disclosure and constitute a part of the specification, and are used for explaining the technical solutions of the present disclosure together with embodiments of the present disclosure, and are not intended to constitute limitations on the technical solutions of the present disclosure. Shapes and sizes of various components in the drawings do not reflect true proportions, and are only intended to schematically illustrate contents of the present disclosure.

Figure 1:
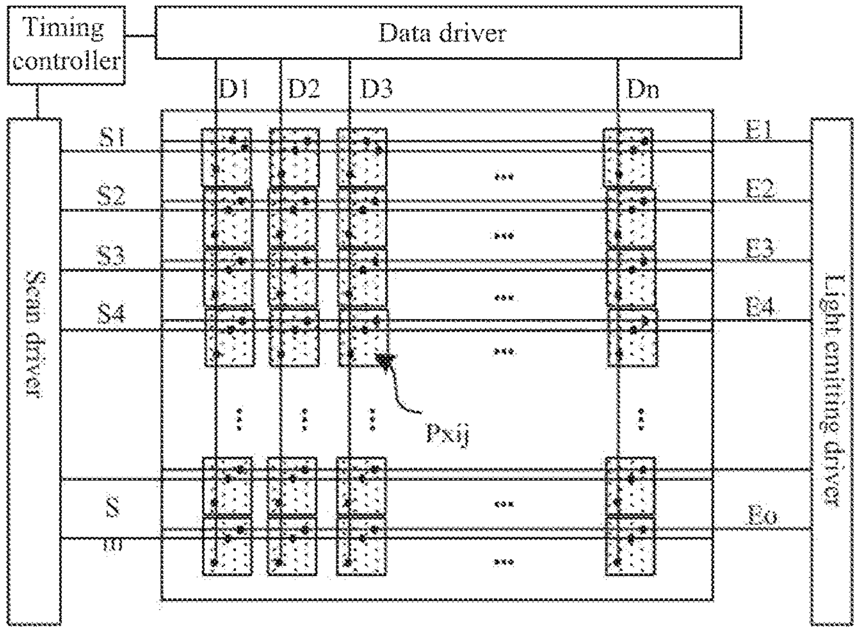
FIG. 1 is a schematic diagram of a structure of a display apparatus.

Reference signs are described as follows.

10-base substrate;
11-first insulation layer;
12-second insulation layer;
13-third insulation layer;
14-fourth insulation layer;
15-planarization layer;
20-drive structure layer;
21-anode;
22-pixel definition layer;
23-organic emitting layer;
24-cathode;
30-light emitting structure layer;
40-encapsulation structure layer;
41-first encapsulation layer;
51-barrier electrode;
52-active layer;

-continued 53-gate electrode;
54-source electrode;
55-drain electrode;
61-gate trace;
62-power supply electrode;
70-auxiliary electrode;
71-first auxiliary electrode;
72-second auxiliary electrode;
73-third auxiliary electrode;
80-light emitting block;
90-cathode block.

DETAILED DESCRIPTION

In order to make objects, technical solutions, and advantages of the present disclosure more clear, the embodiments of the present disclosure will be described below in detail in combination with the drawings. It is to be noted that implementation modes may be implemented in multiple different forms. Those of ordinary skills in the art may readily understand a fact that modes and contents may be transformed into various forms without departing from the purpose and scope of the present disclosure. Therefore, the present disclosure should not be interpreted as being limited to the contents recorded in following implementation modes only. The embodiments in the present disclosure and features in the embodiments may be arbitrarily combined with each other without conflicts. In order to keep following description of the embodiments of the present disclosure clear and concise, detailed descriptions of some known functions and known components are omitted in the present disclosure. The drawings of the embodiments of the present disclosure relate only to structures involved in the embodiments of the present disclosure, and other structures may be referred to conventional designs.

Scales of the drawings in the present disclosure may be used as references in the actual processes, but are not limited thereto. For example, a width-to-length ratio of a channel, thicknesses and pitches of various film layers, and widths and pitches of various signal lines may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes or numerical values shown in the drawings.

In the specification, ordinal numerals such as "first", "second", and "third" are set in order to avoid confusion of constituent elements, but not to set a limit in quantity.

In the specification, for convenience, terms such as "middle", "upper", "lower", "front", "back", "vertical", "horizontal", "top", "bottom", "inside", and "outside" indicating orientations or positional relationships are used for illustrating positional relationships between the constituent elements with reference to the drawings, and are only intended to facilitate description of the specification and simplification of the description, but not to indicate or imply that a referred apparatus or element must have a specific orientation or be constructed and operated in a specific orientation, therefore, they should not be understood as limitations on the present disclosure. The positional relationships between the constituent elements are appropriately changed according to directions of describing the constituent elements. Therefore, words and phrases used in the specification are not limited and appropriate substitutions may be made according to situations.

In the specification, unless otherwise specified and defined explicitly, terms "installed", "mutual connected", and "connected" should be understood in a broad sense. For example, a connection may be a fixed connection, a detachable connection, or an integrated connection; it may be a mechanical connection or an electrical connection; it may be a direct connection, an indirect connection through an intermediate component, or communication inside two elements. Specific meanings of the above terms in the present disclosure may be understood by a person of ordinary skill in the art according to specific situations.

In the specification, a transistor refers to an element which at least includes three terminals: a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that in the specification, the channel region refers to a region which the current mainly flows through.

In the specification, a first electrode may be a drain electrode and a second electrode may be a source electrode, or a first electrode may be a source electrode and a second electrode may be a drain electrode. In a case that transistors with opposite polarities are used or a case that a direction of a current is changed during circuit operation, functions of the "source electrode" and the "drain electrode" are sometimes interchanged. Therefore, the "source electrode" and the "drain electrode" may be interchanged in the specification.

In the specification, an "electrical connection" includes a case where constituent elements are connected together through an element with a certain electrical effect. The "element with the certain electrical effect" is not particularly limited as long as electrical signals may be sent and received between the connected constituent elements. Examples of the "element with the certain electrical effect" not only include an electrode and a wiring, but also include a switching element such as a transistor, a resistor, an inductor, a capacitor, and other elements with various functions, etc.

In the specification, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 80° and less than 100°, and thus also includes a state in which the angle is greater than 85° and less than 95°.

In the specification, a "film" and a "layer" may be interchangeable. For example, sometimes a "conductive layer" may be replaced by a "conductive film". Similarly, sometimes an "insulation film" may be replaced by an "insulation layer".

A triangle, rectangle, trapezoid, pentagon, hexagon, or the like in the specification are not in the strict sense, and it may be an approximate triangle, rectangle, trapezoid, pentagon, hexagon, or the like, there may be some small deformation caused by tolerance, or there may be a chamfer, an arc edge, and deformation, etc.

"About" in the present disclosure means that a boundary is not defined strictly and numerical values in process and measurement error ranges are allowed FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include a plurality of sub-pixels Pxij, wherein i and j may be natural numbers. At least one sub-pixel Pxij may include a circuit unit and a light emitting device connected with the circuit unit, wherein the circuit unit may include a pixel drive circuit which is connected with a scan signal line, a data signal line, and a light emitting signal line, respectively. In an exemplary implementation mode, the timing controller may provide a grayscale value and a control signal suitable for the specification of the data signal driver to the data signal driver, may provide a clock signal, a scan start signal, etc. suitable for the specification of the scan driver to the scan driver, and may provide a clock signal, an emission stop signal, etc. suitable for the specification of the light emitting driver to the light emitting driver. The data driver may generate a data voltage to be provided to the data signal lines D1, D2, D3, . . . , and Dn using the grayscale value and the control signal that are received from the timing controller. For example, the data driver may sample the grayscale value using the clock signal and apply a data voltage corresponding to the grayscale value to the data signal lines D1 to Dn by taking a row of pixels as a unit, wherein n may be a natural number. The scan driver may generate a scan signal to be provided to the scan signal lines S1, S2, S3, . . . , and Sm by receiving the clock signal, the scan start signal, etc. from the timing controller. For example, the scan driver may sequentially provide a scan signal with an on-level pulse to the scan signal lines S1 to Sm. For example, the scan driver may be constructed in a form of a shift register and generate a scan signal in a manner of sequentially transmitting a scan start signal provided in a form of an on-level pulse to a next-stage circuit under control of the clock signal, wherein m may be a natural number. The light emitting driver may generate an emission signal to be provided to the light emitting signal lines E1, E2, E3, . . . , and Eo by receiving the clock signal, the emission stop signal, etc. from the timing controller. For example, the light emitting driver may sequentially provide an emission signal with an off-level pulse to the light emitting signal lines E1 to Eo. For example, the light emitting driver may be constructed in a form of a shift register and generate an emission signal in a manner of sequentially transmitting an emission stop signal provided in a form of an off-level pulse to a next-stage circuit under control of the clock signal, wherein o may be a natural number.

Figure 2:
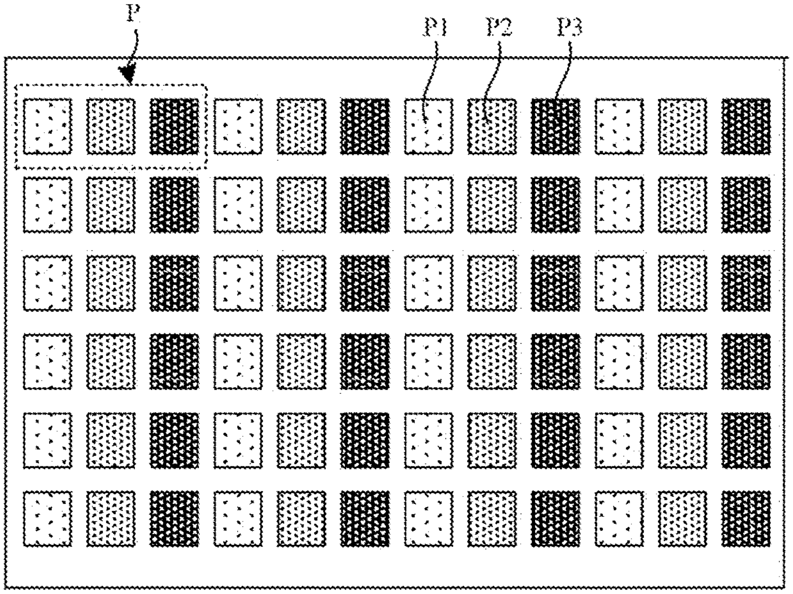
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix, at least one of the plurality of pixel units P includes a first sub-pixel P1 emitting light of a first color, a second sub-pixel P2 emitting light of a second color, and a third sub-pixel P3 emitting light of a third color, and the first sub-pixel P1, the second sub-pixel P2, and the third sub-pixel P3 each includes a pixel drive circuit and a light emitting device. Pixel drive circuits in the first sub-pixel P1, the second sub-pixel P2, and the third sub-pixel P3 are connected with a scan signal line, a data signal line, and a light emitting signal line respectively. A pixel drive circuit is configured to receive a data voltage transmitted by the data signal line under control of the scan signal line and the light emitting signal line, and output a corresponding current to the light emitting device. Light emitting devices in the first sub-pixel P1, the second sub-pixel P2, and the third sub-pixel P3 are respectively connected with a pixel drive circuit of a sub-pixel where a light emitting device is located, and the light emitting device is configured to emit light with corresponding brightness in response to a current output by the pixel drive circuit of the sub-pixel where the light-emitting device is located.

In an exemplary implementation mode, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary implementation mode, a sub-pixel may be in a shape of a rectangle, a rhombus, a pentagon, or a hexagon. Three sub-pixels may be arranged side by side horizontally, side by side vertically, or in a manner like a Chinese character "品", the present disclosure is not limited thereto.

In other exemplary implementation modes, a pixel unit may include four sub-pixels, which may be arranged side by side horizontally, side by side vertically, or in a shape of a square, the present disclosure is not limited thereto.

Figure 3:
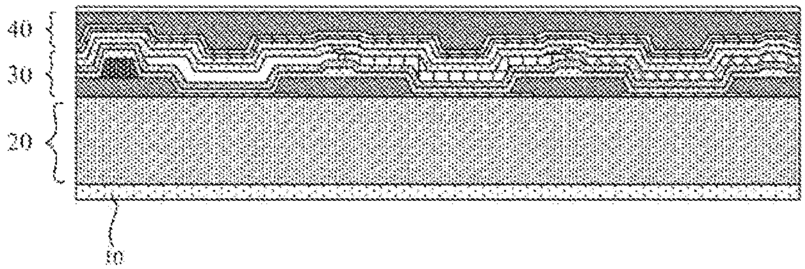
FIG. 3 is a schematic diagram of a planar structure of a display region.

FIG. 3 is a schematic sectional view of a display substrate, which illustrates a structure of three sub-pixels of an OLED display substrate. As shown in FIG. 3, on a plane perpendicular to the display substrate, the display substrate may include a drive structure layer 20 disposed on a base substrate 10, a light emitting structure layer 30 disposed on one side of the drive structure layer 20 away from the base substrate 10, and an encapsulation structure layer 40 disposed on one side of the light emitting structure layer 30 away from the base substrate 10. In some possible implementation modes, the display substrate may include another film layer, such as a touch structure layer, the present disclosure is not limited thereto.

In an exemplary implementation mode, the base substrate 10 may be a flexible base substrate, or may be a rigid base substrate. A drive structure layer 20 of each sub-pixel may include a plurality of transistors and a storage capacitor, which form a pixel drive circuit. The light emitting structure layer 30 may include an anode, a pixel definition layer, an organic emitting layer, and a cathode. The anode is connected with a drain electrode of a drive transistor through a via, the organic emitting layer is connected with the anode, the cathode is connected with the organic emitting layer, and the organic emitting layer emits light of corresponding color under drive of the anode and the cathode. The encapsulation structure layer 40 may include a first encapsulation layer, a second encapsulation layer, and a third encapsulation layer that are stacked. The first encapsulation layer and the third encapsulation layer may be made of inorganic materials, and the second encapsulation layer may be made of an organic material. The second encapsulation layer is disposed between the first encapsulation layer and the third encapsulation layer, which may ensure that external water vapor cannot enter the light emitting structure layer 30.

Figure 4:
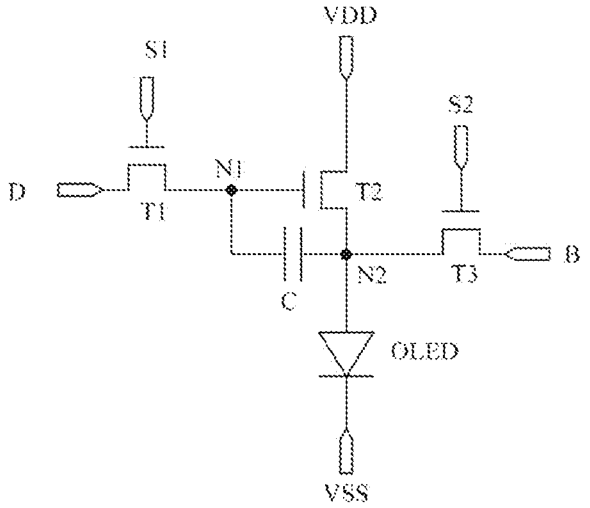
FIG. 4 is a schematic diagram of an equivalent circuit of a pixel drive circuit.

FIG. 4 is a schematic diagram of an equivalent circuit of a pixel drive circuit. In an exemplary implementation mode, the pixel drive circuit may be of a structure of 3T1C, 4T1C, 5T1C, 5T2C, 6T1C, or 7T1C. As shown in FIG. 4, the pixel drive circuit is of a structure of 3T1C, which may include three switching transistors (a first transistor T1, a second transistor T2, and a third transistor T3), one storage capacitor C, and six signal lines (a data signal line D, a first scan line S1, a second scan line S2, a compensation line B, a first power supply line VDD, and a second power supply line VSS). In an exemplary implementation mode, the first transistor T1 is a switching transistor, the second transistor T2 is a drive transistor, and the third transistor T3 is a compensation transistor. A gate electrode of the first transistor T1 is coupled to the first scan line S1, a first electrode of the first transistor T1 is coupled to the data line D, and a second electrode of the first transistor T1 is coupled to a gate electrode of the second transistor T2. The first transistor T1 is configured to receive a data signal transmitted by the data line D under control of the first scan line S1, so that the gate electrode of the second transistor T2 receives the data signal. The gate electrode of the second transistor T2 is coupled to the second electrode of the first transistor T1, a first electrode of the second transistor T2 is coupled to the first power supply line VDD, and a second electrode of the second transistor T2 is coupled to a first electrode of an OLED. The second transistor T2 is configured to generate a corresponding current at the second electrode under control of the data signal received by its gate electrode. A gate electrode of the third transistor T3 is coupled to the second scan line S2, a first electrode of the third transistor T3 is connected with the compensation line B, and a second electrode of the third transistor T3 is coupled to the second electrode of the second transistor T2. The third transistor T3 is configured to extract a threshold voltage Vth of the second transistor T2 and mobility in response to a compensation timing to compensate the threshold voltage Vth. The first electrode of the OLED is coupled to the second electrode of the second transistor T2, and a second electrode of the OLED is coupled to the second power supply line VSS. The OLED is configured to emit light with corresponding brightness in response to a current of the second electrode of the second transistor T2. A first electrode of the storage capacitor C is coupled to the gate electrode of the second transistor T2, and a second electrode of the storage capacitor C is coupled to the second electrode of the second transistor T2. The storage capacitor C is configured to store a potential of the gate electrode of the second transistor T2.

In an exemplary implementation mode, a signal of the first power supply line VDD is a high-level signal continuously provided, and a signal of the second power supply line VSS is a low-level signal. The first transistor T1 to the third transistor T3 may be P-type transistors or may be N-type transistors. Using a same type of transistors in the pixel drive circuit may simplify process flows, decrease process difficulties of a display panel, and improve a yield of products. In some possible implementation modes, the first transistor T1 to the third transistor T3 may include a P-type transistor and an N-type transistor.

In an exemplary implementation mode, the light emitting device may be an Organic Light Emitting Diode (OLED) including a first electrode (anode), an organic emitting layer, and a second electrode (cathode) that are stacked.

According to a light emitting direction, the OLED display substrate may be divided into three types: a bottom emission OLED, a top emission OLED, and a double-sided emission OLED. The bottom emission OLED emits light from a bottom direction of the base substrate, the top emission OLED emits light from a top direction of the base substrate, and the double-sided emission OLED emits light from the bottom direction and the top direction of the base substrate at the same time. Compared with the bottom emission OLED, the top emission OLED has advantages of a high aperture ratio, a high color purity, and being easy to achieve high Pixels Per Inch (PPI), etc., and thus has aroused people's widespread attention.

For the top emission OLED, since a light emitting direction is at one side of a cathode, the cathode is required to have better light transmittance and conductivity, especially for a large-size transparent display apparatus. Transparent display, which is an important personalized display field of display technologies, means that an image is displayed in a transparent state such that viewers may not only see a video image in a display apparatus but also see a scene behind the display apparatus. It may be widely used in vehicle display such as cars/subways and window display such as hotels/clothing stores, and has significant advantages such as clear image quality and a realistic display effect. In order to improve a transparency effect, a thickness of the cathode is required to be very thin in the large-size transparent display apparatus, so there is a problem of the cathode having a larger impedance, resulting in not only increase in voltage and increase in power consumption, but also uneven voltage distribution on the cathode and uneven brightness.

An exemplary embodiment of the present disclosure provides a display substrate including a drive structure layer disposed on a base substrate and a light emitting structure layer disposed on one side of the drive structure layer away from the base substrate, the light emitting structure layer at least including a cathode and an auxiliary electrode, and the cathode being connected with the auxiliary electrode; the auxiliary electrode includes a first auxiliary electrode, a second auxiliary electrode, and a third auxiliary electrode stacked along a direction away from the base substrate, the third auxiliary electrode has a protruding portion relative to a sidewall of the second auxiliary electrode, and the protruding portion and the sidewall of the second auxiliary electrode form an inwardly recessed structure, a protruding distance of the protruding portion being greater than or equal to a thickness of the second auxiliary electrode, and the protruding distance being a distance between an edge of the third auxiliary electrode and the sidewall of the second auxiliary electrode.

In an exemplary implementation mode, the protruding distance is 1.0 to 2.5 times the thickness of the second auxiliary electrode.

In an exemplary implementation mode, a thickness of the third auxiliary electrode is greater than a thickness of the cathode.

In an exemplary implementation mode, the light emitting structure layer further includes an organic emitting layer connected with the cathode, and the protruding distance is 1 to 2 times a thickness of the organic emitting layer.

In an exemplary implementation mode, the thickness of the second auxiliary electrode is greater than a thickness of the organic emitting layer.

In an exemplary implementation mode, the display substrate further includes a first encapsulation layer disposed on one side of the light emitting structure layer away from the base substrate, the first encapsulation layer wraps the auxiliary electrode, a ratio of a thickness of the third auxiliary electrode to a thickness of the organic emitting layer is a first ratio, and a ratio of the thickness of the second auxiliary electrode to a thickness of the first encapsulation layer is a second ratio, and the first ratio is greater than the second ratio.

In an exemplary implementation mode, the light emitting structure layer further includes an anode including a first anode, a second anode, and a third anode stacked along the direction away from the base substrate, an orthographic projection of the second anode on the base substrate is within a range of an orthographic projection of the first anode on the base substrate, and the orthographic projection of the second anode on the base substrate is within a range of an orthographic projection of the third anode on the base substrate.

In an exemplary implementation mode, orthographic projections of the second auxiliary electrode and the third auxiliary electrode on the base substrate are within a range of an orthographic projection of an auxiliary electrode opening on the base substrate.

In an exemplary implementation mode, within the auxiliary electrode opening, the cathode laps over a surface of the first auxiliary electrode on a side away from the base substrate.

In an exemplary implementation mode, there is a first lapping distance between the cathode and a surface of the first auxiliary electrode on a side away from the base substrate, and the protruding distance is less than the first lapping distance.

In an exemplary implementation mode, the light emitting structure layer further includes an organic emitting layer lapping over a surface of the first auxiliary electrode on a side away from the base substrate, and there is the first lapping distance between an edge of the organic emitting layer on a side close to the second auxiliary electrode and the sidewall of the second auxiliary electrode.

In an exemplary implementation mode, the protruding portion is in a shape of an arc drooping towards a direction of the base substrate, and a minimum distance between an edge of the protruding portion on a side close to the organic emitting layer and an edge of the organic emitting layer on a side close to the protruding portion is greater than a thickness of the third auxiliary electrode.

In an exemplary implementation mode, within the auxiliary electrode opening, the cathode laps over the sidewall of the second auxiliary electrode.

In an exemplary implementation mode, there is a second lapping distance between the cathode and the sidewall of the second auxiliary electrode, and the protruding distance is greater than the second lapping distance.

Figure 5:
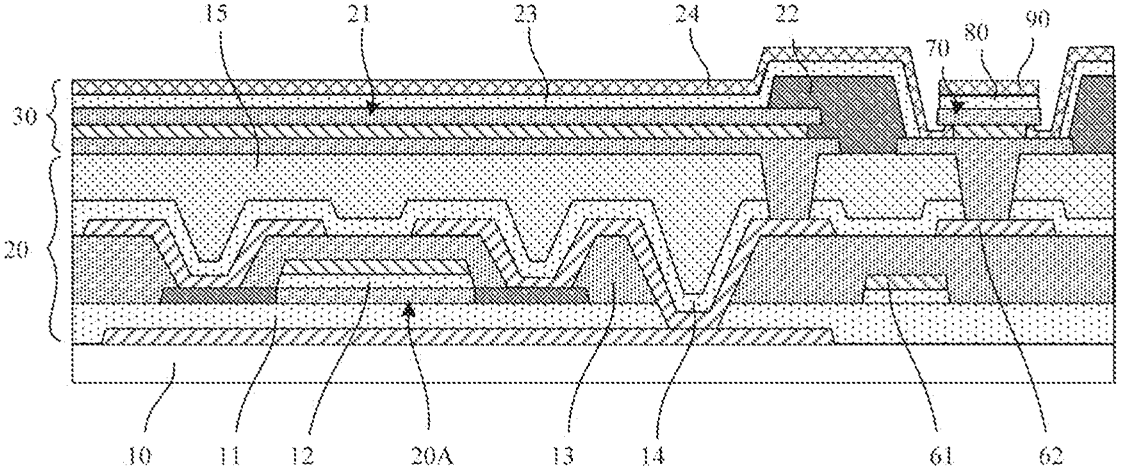
FIG. 5 is a schematic diagram of a structure of a display substrate according to an exemplary embodiment of the present disclosure.

FIG. 5 is a schematic diagram of a structure of a display substrate according to an exemplary embodiment of the present disclosure, which illustrates a cross-sectional structure of one sub-pixel in the display substrate. As shown in FIG. 5, on a plane perpendicular to the display substrate, the display substrate may include a drive structure layer 20 disposed on a base substrate 10 and a light emitting structure layer 30 disposed on one side of the drive structure layer 20 away from the base substrate 10. The drive structure layer 20 may at least include a power supply electrode 62 and a transistor 20A which constitutes a pixel drive circuit. The light emitting structure layer 30 may at least include an anode 21, a pixel definition layer 22, an organic emitting layer 23, a cathode 24, and an auxiliary electrode 70. The anode 21 is connected with a drain electrode of the transistor 20A, the organic emitting layer 23 is connected with the anode 21 and the cathode 24 respectively, the cathode 24 is connected with the auxiliary electrode 70, and the auxiliary electrode 70 is connected with the power supply electrode 62, to form a structure in which a voltage drop of the cathode is decreased using an auxiliary electrode.

In an exemplary implementation mode, the drive structure layer 20 may include a first conductive layer, a first insulation layer 11, a semiconductor layer, a second insulation layer 12, a second conductive layer, a third insulation layer 13, a third conductive layer, a fourth insulation layer 14, and a planarization layer 15 disposed sequentially on the base substrate 10. The first conductive layer may at least include a barrier electrode, the semiconductor layer may at least include an active layer, the second conductive layer may at least include a gate electrode and a gate trace 61, and the third conductive layer may at least include a source electrode, a drain electrode, and the power supply electrode 62. The barrier electrode, the active layer, the gate electrode, the source electrode, and the drain electrode may constitute the transistor 20A.

In an exemplary implementation mode, the gate trace 61 and the gate electrode in the transistor 20A may be disposed in a same layer, be made of a same material, and be formed simultaneously through a same patterning process.

In an exemplary implementation mode, the power supply electrode 62 and the source electrode and drain electrode in the transistor 20A may be disposed in a same layer, be made of a same material, and be formed simultaneously through a same patterning process.

Figure 6:
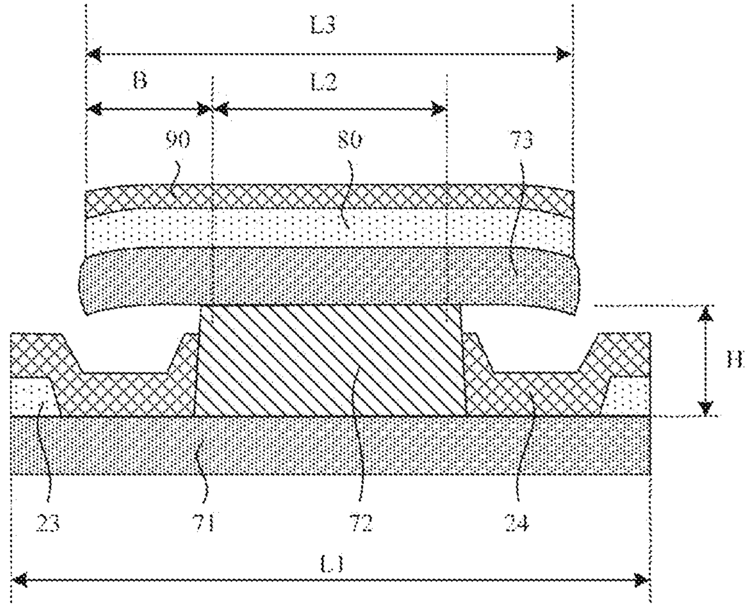
FIG. 6 is an enlarged view of an auxiliary electrode region in FIG. 5.

FIG. 6 is an enlarged view of an auxiliary electrode region in FIG. 5. As shown in FIG. 6, in an exemplary implementation mode, on a plane perpendicular to the display substrate, the auxiliary electrode 70 may include a first auxiliary electrode 71, a second auxiliary electrode 72 disposed on one side of the first auxiliary electrode 71 away from the base substrate, and a third auxiliary electrode 73 disposed on one side of the second auxiliary electrode 72 away from the base substrate. The first auxiliary electrode 71, the second auxiliary electrode 72, and third auxiliary electrode 73 which are stacked form a "丅"-shaped structure, and the first auxiliary electrode 71 is connected with the power supply electrode 62 through a via.

In an exemplary implementation mode, a second width L2 of the second auxiliary electrode 72 is less than a first width L1 of the first auxiliary electrode 71, and an orthographic projection of the second auxiliary electrode 72 on the base substrate may be within a range of an orthographic projection of the first auxiliary electrode 71 on the base substrate.

In an exemplary implementation mode, a second width L2 of the second auxiliary electrode 72 is less than a third width L3 of the third auxiliary electrode 73, and an orthographic projection of the second auxiliary electrode 72 on the base substrate may be within a range of an orthographic projection of the third auxiliary electrode 73 on the base substrate.

In an exemplary implementation mode, a third width L3 of the third auxiliary electrode 73 is less than a first width L1 of the first auxiliary electrode 71, and an orthographic projection of the third auxiliary electrode 73 on the base substrate may be within a range of an orthographic projection of the first auxiliary electrode 71 on the base substrate.

In an exemplary implementation mode, on a plane perpendicular to the base substrate, a cross section of the second auxiliary electrode 72 may be in a shape of a trapezoid.

In an exemplary implementation mode, on a plane parallel to the base substrate, the third auxiliary electrode 73 has a protruding portion relative to a sidewall of the second auxiliary electrode 72, and the protruding portion and the sidewall of the second auxiliary electrode 72 form an inwardly recessed structure. The protruding portion has a protruding distance B, which is a distance between an edge of the third auxiliary electrode 73 and the sidewall of the second auxiliary electrode 72. On a plane perpendicular to the base substrate, the second auxiliary electrode 72 has a thickness H, which may be a distance between a surface of the second auxiliary electrode 72 on a side close to the base substrate and a surface of the second auxiliary electrode 72 on a side away from the base substrate.

In an exemplary implementation mode, the protruding distance B may be greater than or equal to the thickness H of the second auxiliary electrode.

In an exemplary implementation mode, the protruding distance B/the thickness H of the second auxiliary electrode may be about 1.0 to 2.5, i.e., the protruding distance B may be about 1.0 to 2.5 times the thickness H of the second auxiliary electrode.

In an exemplary implementation mode, the protruding distance B/the thickness H of the second auxiliary electrode may be about 1.5 to 2.0, i.e., the protruding distance B may be about 1.5 to 2.0 times the thickness H of the second auxiliary electrode.

In an exemplary implementation mode, on a plane parallel to the display substrate, the auxiliary electrode 70 may be in a shape of any one or more of a triangle, a square, a rectangle, a pentagon, a hexagon, a circle, and an ellipse.

In an exemplary implementation mode, on the plane perpendicular to the display substrate, the anode 21 may include a first anode, a second anode, and a third anode that are stacked, an orthographic projection of the second anode on the base substrate may be within a range of an orthographic projection of the first anode on the base substrate, and the orthographic projection of the second anode on the base substrate may be within a range of an orthographic projection of the third anode on the base substrate.

In an exemplary implementation mode, the first auxiliary electrode 71 and the first anode may be disposed in a same layer, be made of a same material, and be formed simultaneously through a same patterning process.

In an exemplary implementation mode, the second auxiliary electrode 72 and the second anode are disposed in a same layer and are made of a same material, and the third auxiliary electrode 73 and the third anode are disposed in a same layer and are made of a same material.

In an exemplary implementation mode, a pixel opening and an auxiliary electrode opening are provided in a pixel definition layer 22 in the light emitting structure layer 30, the pixel opening exposes a surface of the third anode of the anode 21, and the auxiliary electrode opening exposes a whole surface of the third auxiliary electrode 73 and a portion of a surface of the first auxiliary electrode 71 in the auxiliary electrode.

In an exemplary implementation mode, orthographic projections of the second auxiliary electrode 72 and the third auxiliary electrode 73 on the base substrate are within a range of an orthographic projection of the auxiliary electrode opening on the base substrate.

In an exemplary implementation mode, within the auxiliary electrode opening, the cathode 24 is connected with an exposed surface of the first auxiliary electrode 71, i.e., at least a portion of the surface of the first auxiliary electrode 71 is bonded with the cathode 24.

In an exemplary implementation mode, within the auxiliary electrode opening, the cathode is connected with a sidewall of the second auxiliary electrode 72, i.e., at least a portion of the sidewall of the second auxiliary electrode 72 is bonded with the cathode 24.

In an exemplary implementation mode, the light emitting structure layer 30 further includes a light emitting block 80 located in the auxiliary electrode opening, the light emitting block 80 is disposed on one side of the third auxiliary electrode 73 in the auxiliary electrode 70 away from the base substrate, an orthographic projection of the light emitting block 80 on the base substrate is within a range of an orthographic projection of the third auxiliary electrode 73 on the base substrate, and the light emitting block 80 is isolated from the organic emitting layer 23.

In an exemplary implementation mode, the light emitting structure layer 30 further includes a cathode block 90 located within the auxiliary electrode opening, the cathode block 90 is disposed on one side of the light emitting block 80 away from the base substrate, an orthographic projection of the cathode block 90 on the base substrate is within a range of an orthographic projection of the light emitting block 80 on the base substrate, and the cathode block 90 is isolated from the cathode 24.

The following is an exemplary explanation through a preparation process of a display substrate. A "patterning process" mentioned in the present disclosure includes photoresist coating, mask exposure, development, etching, photoresist stripping, and another treatment, for a metal material, an inorganic material, or a transparent conductive material, and includes organic material coating, mask exposure, development, and another treatment, for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film made of a certain material on a base substrate using deposition, coating, or another process. If the "thin film" does not need a patterning process in an entire preparation process, the "thin film" may also be called a "layer". If the "thin film" needs the patterning process in the entire preparation process, the "thin film" is called a "thin film" before the patterning process and is called a "layer" after the patterning process. The "layer" after the patterning process contains at least one "pattern". "A and B being disposed in a same layer" mentioned in the present disclosure means that A and B are formed simultaneously through a same patterning process, and a "thickness" of a film layer is a dimension of the film layer in a direction perpendicular to the display substrate. In an exemplary embodiment of the present disclosure, "an orthographic projection of B being within a range of an orthographic projection of A" means that a boundary of the orthographic projection of B falls within a range of a boundary of the orthographic projection of A, or a boundary of the orthographic projection of A is overlapped with a boundary of the orthographic projection of B.

In an exemplary implementation mode, the preparation process of the display substrate may include following operations.

(1) A base substrate is provided. In an exemplary implementation mode, the base substrate may be a flexible base substrate, or may be a rigid base substrate. In an exemplary implementation mode, the flexible base substrate may include a first flexible material layer, a first inorganic material layer, a semiconductor layer, a second flexible material layer, and a second inorganic material layer which are stacked. Materials of the first flexible material layer and the second flexible material layer may be Polyimide (PI), Polyethylene Terephthalate (PET), or surface treated polymer soft film, etc., and materials of the first inorganic material layer and the second inorganic material layer may be Silicon Nitride (SiNx) or Silicon Oxide (SiOx), for improving water and oxygen resistance of the base substrate. The first inorganic material layer and the second inorganic material layer may also be referred to as barrier layers. A material of the semiconductor layer may be amorphous silicon (a-si). In an exemplary implementation mode, taking one stacked structure as an example, its preparation process may include: first coating a layer of polyimide on a glass carrier board, and forming a first flexible (PI1) layer after being cured to form a film;

then depositing a layer of barrier thin film on the first flexible layer to form a first barrier (Barrier 1) layer covering the first flexible layer; then depositing a layer of amorphous silicon thin film on the first barrier layer to form an amorphous silicon (a-si) layer covering the first barrier layer; then coating a layer of polyimide again on the amorphous silicon layer, and forming a second flexible (PI2) layer after being cured to form a film; and then depositing a layer of barrier thin film on the second flexible layer to form a second barrier (Barrier 2) layer covering the second flexible layer, so as to complete preparation of the base substrate.

(2) A pattern of a drive structure layer is prepared on the base substrate. In an exemplary implementation mode, a preparation process of the drive structure layer may include following operations.

A first conductive thin film is deposited on a base substrate 10, and the first conductive thin film is patterned through a patterning process to form a pattern of a first conductive layer disposed on the base substrate 10, and the first conductive layer at least includes a barrier electrode 51.

Then, a first insulation thin film and a semiconductor thin film are deposited sequentially, and the semiconductor thin film is patterned through a patterning process to form a first insulation layer 11 covering a pattern of the barrier electrode and a pattern of a semiconductor layer disposed on the first insulation layer 11, the pattern of the semiconductor layer at least includes an active layer 52, and an orthographic projection of the active layer 52 on the base substrate is within a range of an orthographic projection of the barrier layer 51 on the base substrate.

Then, a second insulation thin film and a second conductive thin film are deposited sequentially, the second conductive thin film and the second insulation thin film are patterned through a patterning process to form a second insulation layer 12 disposed on the pattern of the semiconductor layer and a pattern of a second conductive layer disposed on the second insulation layer 12, the pattern of the second conductive layer at least includes a gate electrode 53 and a gate trace 61, an orthographic projection of the gate electrode 53 on the base substrate is within a range of the orthographic projection of the active layer 52 on the base substrate, and an orthographic projection of the pattern of the second conductive layer on the base substrate is within a range of an orthographic projection of the second insulation layer 12 on the base substrate.

Then, the active layer 52 is conducted with a self-aligned conductive process using shielding of photoresist on the gate electrode 53, so that the active layer 52 forms a channel region and conductor regions located on both sides of the channel region.

Then, a third insulation thin film is deposited, and the third insulation thin film is patterned through a patterning process to form a third insulation layer 13 covering the pattern of the second conductive layer, patterns of an active via and a barrier via are provided on the third insulation layer 13. Two active vias are located in the conductor regions at both ends of the active layer 52, and the third insulation layer 13 in the active vias is etched away to expose a surface of the active layer 52. At least one barrier via is located at a position where an edge of the barrier layer 51 is located, and the third insulation layer 13 and the first insulation layer 11 in the barrier via are etched away to expose a surface of the barrier layer 51.

Then, a third conductive thin film is deposited, and the third conductive thin film is patterned through a patterning process to form a pattern of a third conductive layer on the third insulation layer 13, the pattern of the third conductive layer at least includes a source electrode 54, a drain electrode 55, and a power supply electrode 62. The source electrode 54 and the drain electrode 55 are respectively connected with the active layer 52 through the active vias, and the drain electrode 55 is connected with the barrier electrode 51 through the barrier via.

Then, a fourth insulation thin film is deposited, a planarization thin film is then coated on the fourth insulation thin film, and the planarization thin film and the fourth insulation thin film are patterned through a patterning process to form a fourth insulation layer 14 covering the pattern of the third conductive layer and form a planarization layer 15 disposed on the fourth insulation layer 14, a first via K1 and a second via K2 are provided on the fourth insulation layer 14 and the planarization layer 15. The planarization layer 15 and the fourth insulation layer 14 in the first via K1 are etched away to expose a surface of the drain electrode 55, and the planarization layer 15 and the fourth insulation layer 14 in the second via K2 are etched away to expose a surface of the power supply electrode 62.

Figure 7:
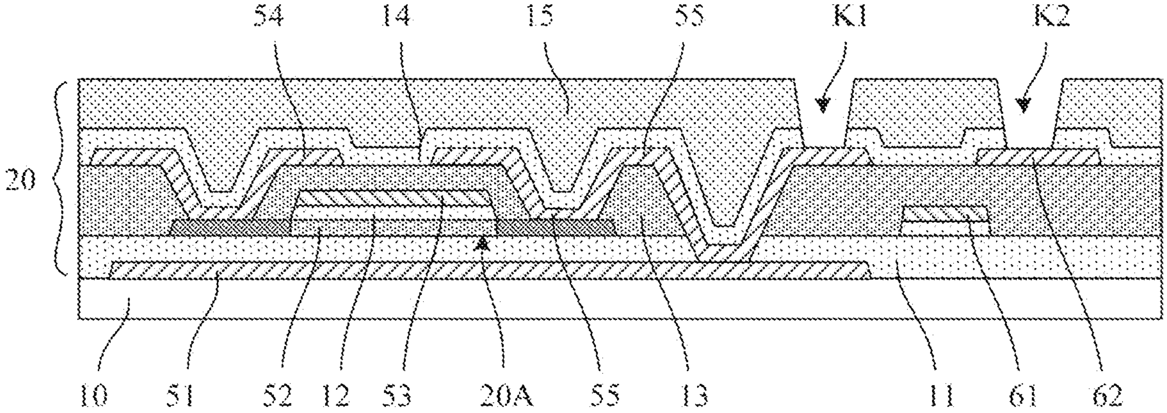
FIG. 7 is a schematic diagram after a pattern of a drive structure layer is formed according to an exemplary embodiment of the present disclosure.

So far, preparation of a pattern of the drive structure layer 20 is completed on the base substrate 10, as shown in FIG. 7. In an exemplary implementation mode, the barrier electrode 51, the active layer 52, the gate electrode 53, the source electrode 54, and the drain electrode 55 may form a transistor 20A with a top gate structure. The transistor with the top gate structure has a characteristic such as a short channel, which may effectively improve an on-state current (Ion), significantly improve a display effect, and effectively reduce power consumption. In addition, an overlapping area between a gate and a source and drain of the transistor with the top gate structure is relatively small and a parasitic capacitance is relatively small, and possibility of defects such as source-drain short circuit (GDS) is relatively low. In an exemplary implementation mode, the power supply electrode 62 may be used as an electrode for transmitting a low-voltage power supply signal. For example, the power supply electrode 62 may be connected with a second power supply line VSS. In an exemplary implementation mode, the transistor 20A may be a drive transistor in a pixel drive circuit, and the drive transistor may be a thin film transistor.

In an exemplary implementation mode, the first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a multi-layer, or a composite layer. The first insulation layer is referred to as a buffer layer, the second insulation layer is referred to as a Gate Insulator (GI) layer, the third insulation layer is referred to as an Interlayer Dielectric (ILD) layer, and the fourth insulation layer is referred to as a Passivation (PVX) layer. The planarization thin film may be made of an organic material, such as resin. The first conductive layer, the second conductive layer, and the third conductive layer may be made of a metal material, such as any one or more of Argentum (Ag), Copper (Cu), Aluminum (Al), Titanium (Ti), and Molybdenum (Mo), or an alloy material of the aforementioned metals, such as an Aluminum Neodymium alloy (AlNd) or a Molybdenum Niobium alloy (MoNb), and may be of a single-layer structure or a multi-layer composite structure, such as Ti/Al/Ti. The semiconductor layer may be made of various materials, such as amorphous Indium Gallium Zinc Oxide (a-IGZO), Zinc Oxynitride (ZnON), Indium Zinc Tin Oxide (IZTO), amorphous Silicon (a-Si), polycrystalline Silicon (p-Si), sexithiophene, and polythiophene, that is, the present disclosure is applicable to transistors manufactured based on an oxide technology, a silicon technology, and an organic matter technology.

Figure 8:
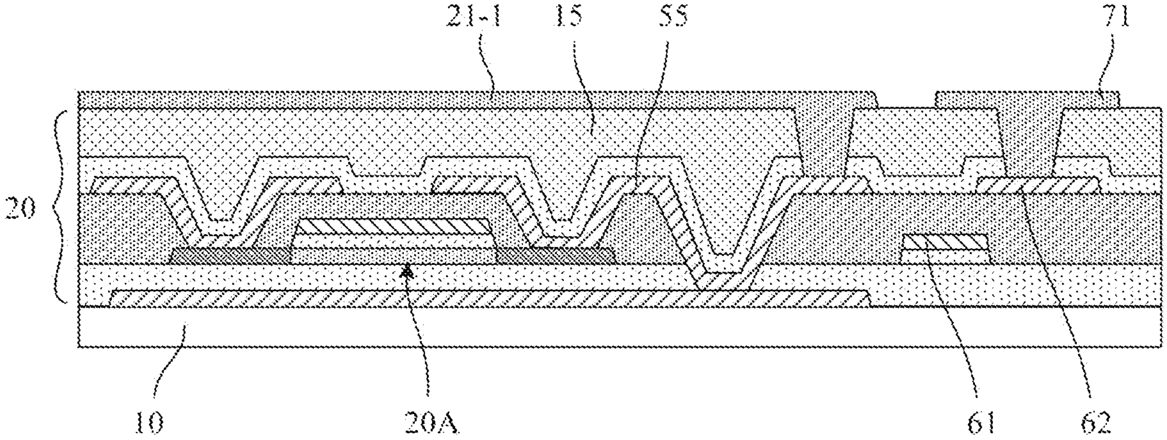
FIG. 8 is a schematic diagram after a pattern of a first anode conductive layer is formed according to an embodiment of the present disclosure.

(3) A pattern of a first anode conductive layer is formed. In an exemplary implementation mode, forming the pattern of the first anode conductive layer may include: depositing a first transparent conductive thin film on the base substrate on which the aforementioned patterns are formed, and patterning the first transparent conductive thin film through a patterning process to form the pattern of the first anode conductive layer disposed on the planarization layer 15, wherein the pattern of the first anode conductive layer at least includes a first anode 21-1 and a first auxiliary cathode 71, the first anode 21-1 is connected with the drain electrode 55 of the transistor 20A through the first via K1, and the first auxiliary cathode 71 is connected with the power supply electrode 62 through the second via K2, as shown in FIG. 8.

In an exemplary implementation mode, the first transparent conductive thin film may be made of a transparent conductive material such as Indium Tin Oxide (ITO).

Figure 9:
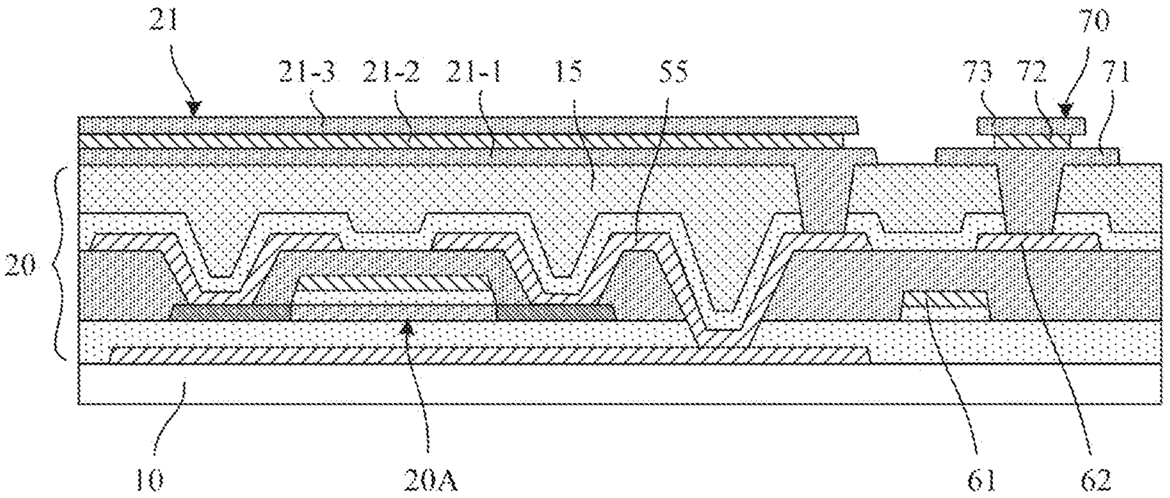
FIG. 9 is a schematic diagram after patterns of a second anode conductive layer and a third anode conductive layer are formed according to an embodiment of the present disclosure.

(4) Patterns of a second anode conductive layer and a third anode conductive layer are formed. In an exemplary implementation mode, forming the patterns of the second anode conductive layer and the third anode conductive layer may include: depositing sequentially a reflective thin film and a second transparent conductive thin film on the base substrate on which the aforementioned patterns are formed, and patterning the reflective thin film and the second transparent conductive thin film through a patterning process to form the patterns of the second anode conductive layer and the third anode conductive layer, wherein a pattern of the second anode conductive layer at least includes a second anode 21-2 and a second auxiliary cathode 72, and a pattern of the third anode conductive layer at least includes a third anode 21-3 and a third auxiliary cathode 73, as shown in FIG. 9.

In an exemplary implementation mode, the second transparent conductive thin film may be made of a transparent conductive material such as Indium Tin Oxide (ITO), and the reflective thin film may be made of a metal material such as Aluminum (Al), therefore an auxiliary cathode 70 has very strong electrical conductivity, which is beneficial to solving a problem of cathode voltage drop.

In an exemplary implementation mode, the second anode 21-2 may be disposed on one side of the first anode 21-1 away from the base substrate and lap over the first anode 21-1, and the third anode 21-3 may be disposed on one side of the second anode 21-2 away from the base substrate and lap over the second anode 21-2, and the first anode 21-1, the second anode 21-2, and the third anode 21-3 form an anode 21.

In an exemplary implementation mode, the second auxiliary cathode 72 may be disposed on one side of the first auxiliary cathode 71 away from the base substrate and lap over the first auxiliary cathode 71, and the third auxiliary cathode 73 may be disposed on one side of the second auxiliary cathode 72 away from the base substrate and lap over the second auxiliary cathode 72, and the first auxiliary cathode 71, the second auxiliary cathode 72, and the third auxiliary cathode 73 form the auxiliary cathode 70.

In an exemplary implementation mode, forming the patterns of the second anode conductive layer and the third anode conductive layer may include: after a pattern of photoresist is formed through masking, exposure, and development, first etching the second transparent conductive thin film not covered by the photoresist using a first etching solution to form the third anode 21-3 and the third auxiliary cathode 73, and then etching the exposed reflective thin film using a second etching solution to form the second anode 21-2 and the second auxiliary cathode 72. When the reflective thin film is etched using the second etching solution, the second auxiliary cathode 72 has a relatively large indentation amount by etching the reflective thin film with a relatively large over-etching amount, so that the first auxiliary cathode 71 and the third auxiliary cathode 73 have protruding portions relative to a sidewall of the second auxiliary cathode 72. Both upper and lower protruding portions and the sidewall of the second auxiliary cathode 72 both form an inwardly recessed structure, an orthographic projection of the second auxiliary cathode 72 on the base substrate is within a range of an orthographic projection of the first auxiliary cathode 71 on the base substrate, the orthographic projection of the second auxiliary cathode 72 on the base substrate is within a range of an orthographic projection of the third auxiliary cathode 73 on the base substrate, and the first auxiliary cathode 71, the second auxiliary cathode 72, and the third auxiliary cathode 73 which are stacked form a "工"-shaped structure.

In an exemplary implementation mode, a width of the third auxiliary cathode 73 may be less than a width of the first auxiliary cathode 71, and the orthographic projection of the third auxiliary cathode 73 on the base substrate is within a range of the orthographic projection of the first auxiliary cathode 71 on the base substrate, therefore the auxiliary cathode 70 assumes an overall appearance with a small upper portion and a large lower portion.

In an exemplary implementation mode, since the second anode 21-2 and the second auxiliary cathode 72 are formed simultaneously through a same etching process, the second anode 21-2 also has a relatively large indentation amount, so that the first anode 21-1 and the third anode 21-3 have protruding portions relative to a sidewall of the second anode 21-2. An orthographic projection of the second anode 21-2 on the base substrate is within a range of an orthographic projection of the first anode 21-1 on the base substrate, the orthographic projection of the second anode 21-2 on the base substrate is within a range of an orthographic projection of the third anode 21-3 on the base substrate, and the orthographic projection of the first anode 21-1 on the base substrate is within a range of the orthographic projection of the third anode 21-3 on the base substrate.

In an exemplary implementation mode, the first etching solution may be made of a $H_2SO_4$ series dilute acid, and the second etching solution may be made of a $H_3PO_4$ series concentrated acid. A rate at which the reflective thin film is etched using the second etching solution is greater than a rate at which the second transparent conductive thin film is etched using the second etching solution.

Figure 10:
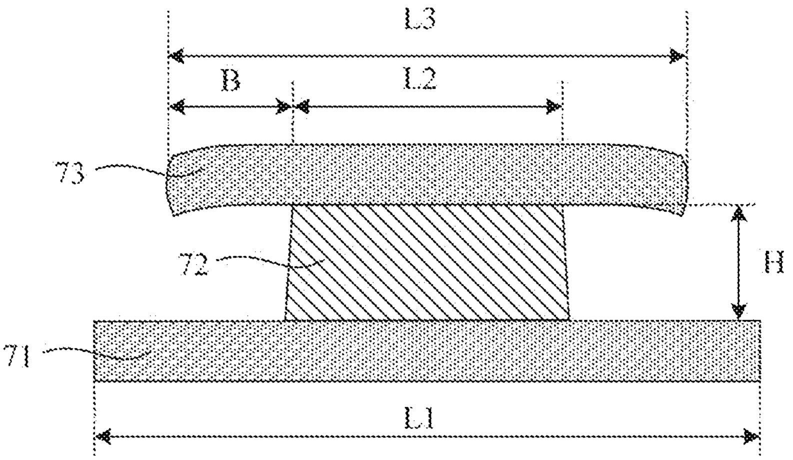
FIG. 10 is a schematic sectional view of an auxiliary electrode according to an embodiment of the present disclosure.

FIG. 10 is a schematic sectional view of an auxiliary electrode according to an embodiment of the present disclosure, which is an enlarged view of the auxiliary electrode in FIG. 9. As shown in FIG. 10, on a plane perpendicular to the display substrate, the auxiliary electrode may include the first auxiliary electrode 71, the second auxiliary electrode 72, and the third auxiliary electrode 73 stacked, that is, the first auxiliary electrode 71 is disposed on one side of the planarization layer away from the base substrate, the second auxiliary electrode 72 is disposed on one side of the first auxiliary electrode 71 away from the base substrate, and the third auxiliary electrode 73 is disposed on one side of the second auxiliary electrode 72 away from the base substrate.

The third auxiliary electrode 73 located on one side (an upper side) of the second auxiliary electrode 72 away from the base substrate has a protruding portion relative to a sidewall of the second auxiliary electrode 72 to form an "eave" structure, the first auxiliary electrode 71 located on one side (a lower side) of the second auxiliary electrode 72 close to the base substrate has a protruding portion relative to the sidewall of the second auxiliary electrode 72 to form a step structure, i.e., the first auxiliary electrode 71 and the third auxiliary electrode 73 each protrude relative to the second auxiliary electrode 72 by a certain distance, so that the first auxiliary electrode 71, the second auxiliary electrode 72, and the third auxiliary electrode 73 stacked form a "工"-shaped structure.

In an exemplary implementation mode, a second width L2 of the second auxiliary electrode 72 may be less than a first width L1 of the first auxiliary electrode 71, and an orthographic projection of the second auxiliary electrode 72 on the base substrate may be within a range of an orthographic projection of the first auxiliary electrode 71 on the base substrate.

In an exemplary implementation mode, a second width L2 of the second auxiliary electrode 72 may be less than a third width L3 of the third auxiliary electrode 73, and an orthographic projection of the second auxiliary electrode 72 on the base substrate may be within a range of an orthographic projection of the third auxiliary electrode 73 on the base substrate.

In an exemplary implementation mode, a third width L3 of the third auxiliary electrode 73 may be less than first a width L1 of the first auxiliary electrode 71, and an orthographic projection of the third auxiliary electrode 73 on the base substrate may be within a range of an orthographic projection of the first auxiliary electrode 71 on the base substrate.

In an exemplary implementation mode, on a plane perpendicular to the base substrate, a cross section of the second auxiliary electrode 72 may be in a shape of a trapezoid, i.e., a width of a surface of the second auxiliary electrode 72 on a side away from the base substrate is less than a width of a surface of the second auxiliary electrode 72 on a side close to the base substrate. In an exemplary implementation mode, a trapezoidal sidewall may be in a shape of a straight line or in a shape of an arc line.

In an exemplary implementation mode, on a plane parallel to the base substrate, the third auxiliary electrode 73 has a protruding distance B relative to the second auxiliary electrode 72, i.e., the protruding portion has the protruding distance B, and the protruding distance B may be a distance between an edge of the third auxiliary electrode 73 and the sidewall of the second auxiliary electrode 72 on the plane parallel to the base substrate. In an exemplary implementation mode, the second auxiliary electrode 72 has a thickness H on a plane perpendicular to the base substrate, and the thickness H of the second auxiliary electrode may be a distance between a surface of the second auxiliary electrode 72 close to the base substrate and a surface of the second auxiliary electrode 72 away from the base substrate on the plane perpendicular to the base substrate.

In an exemplary implementation mode, a ratio of the protruding distance B to the thickness H of the second auxiliary electrode may be about 1.0 to 2.5, i.e., the protruding distance B may be about 1.0 to 2.5 times the thickness H of the second auxiliary electrode.

In an exemplary implementation mode, a ratio of the protruding distance B to the thickness H of the second auxiliary electrode may be about 1.5 to 2.0, i.e., the protruding distance B may be about 1.5 to 2.0 times the thickness H of the second auxiliary electrode.

In an exemplary implementation mode, since the cross section of the second auxiliary electrode 72 is in the shape of the trapezoid, a protruding portion of the third auxiliary electrode 73 protruding from the second auxiliary electrode 72 is in a shape of an arc drooping towards a direction of the base substrate due to lack of support.

In an exemplary implementation mode, a distance between an edge of the third auxiliary electrode 73 and the base substrate may be less than a distance between a surface of the second auxiliary electrode 72 away from the base substrate and the base substrate.

Figure 11:
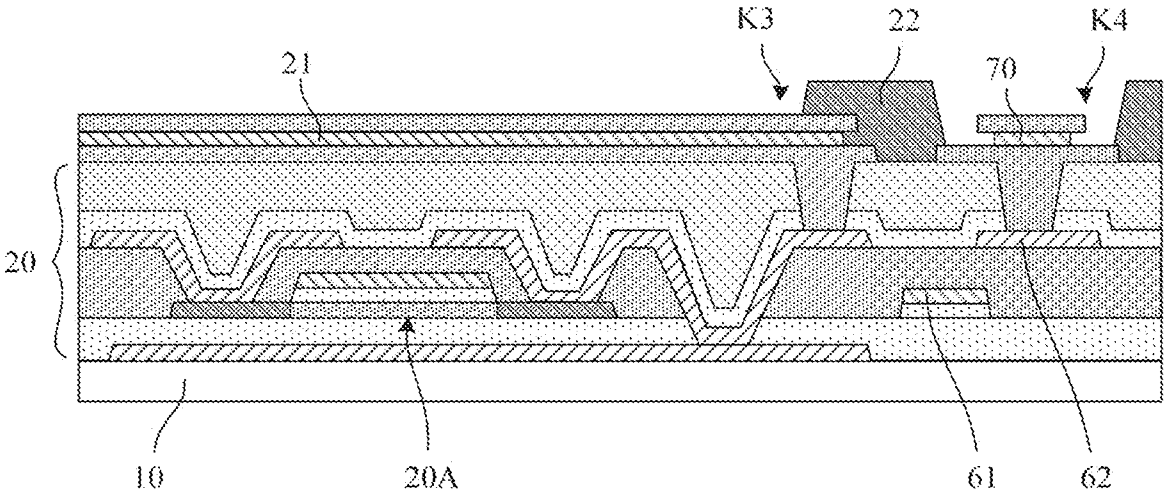
FIG. 11 is a schematic diagram after a pattern of a pixel definition layer is formed according to an embodiment of the present disclosure.

(5) A pattern of a pixel definition layer is formed. In an exemplary implementation mode, forming the pattern of the pixel definition layer may include: coating a pixel definition thin film on the base substrate on which the aforementioned patterns are formed, and patterning the pixel definition thin film through a patterning process to form a pattern of the Pixel Definition Layer (PDL) 22, a pixel opening K3 and an auxiliary electrode opening K4 are provided on the pixel definition layer 22. The pixel definition layer 22 within the pixel opening K3 is removed to expose a surface of the anode 21. The pixel definition layer 22 within the auxiliary electrode opening K4 is removed to expose a surface of the auxiliary electrode 70, as shown in FIG. 11.

In an exemplary implementation mode, the pixel opening K3 exposes a portion of a surface of the third anode 21-3 in the anode 21, and an orthographic projection of the pixel opening K3 on the base substrate may be within a range of orthographic projection of the first anode 21-1, the second anode 21-2, and the third anode 21-3 on the base substrate.

In an exemplary implementation mode, the auxiliary electrode opening K4 exposes a portion of a surface of the first auxiliary electrode 71 in the auxiliary electrode 70, the auxiliary electrode opening K4 exposes an entire surface of the third auxiliary electrode 73 in the auxiliary electrode 70, an orthographic projection of the auxiliary electrode opening K4 on the base substrate is within a range of an orthographic projection of the first auxiliary electrode 71 on the base substrate, and orthographic projections of the second auxiliary electrode 72 and the third auxiliary electrode 73 on the base substrate are within a range of an orthographic projection of the auxiliary electrode opening K4 on the base substrate.

In an exemplary implementation mode, the pixel definition layer may be made of polyimide, acrylic, or polyethylene terephthalate. On a plane parallel to the display substrate, a first pixel opening K3 and the auxiliary electrode opening K4 may be in a shape of a triangle, a rectangle, a polygon, a circle, or an ellipse. On a plane perpendicular to the display substrate, cross sections of the first pixel opening K3 and the auxiliary electrode opening K4 may be in a shape of a rectangle or a trapezoid.

Figure 12:
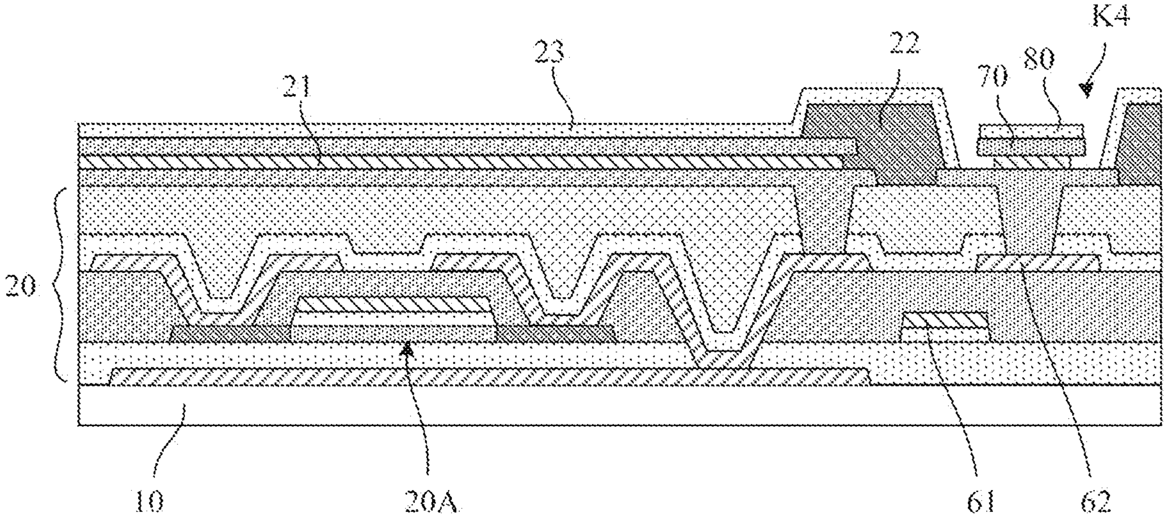
FIG. 12 is a schematic diagram after a pattern of an organic emitting layer is formed according to an embodiment of the present disclosure.

(6) A pattern of an organic emitting layer is formed. In an exemplary implementation mode, forming the pattern of the organic emitting layer may include: evaporating an organic emitting material on the base substrate on which the aforementioned patterns are formed, to form patterns of the organic emitting layer 23 and the light emitting block 80. The organic emitting layer 23 is disposed in a region other than the second auxiliary electrode 72, the organic emitting layer 23 is connected with the anode 21 through the first pixel opening K3, the light emitting block 80 is disposed on a surface of the auxiliary electrode 70, within the auxiliary electrode opening K4, away from the base substrate, and the light emitting block 80 is isolated from the organic emitting layer 23, as shown in FIG. 12.

In an exemplary implementation mode, due to the "⌶"-shaped structure of the auxiliary electrode 70, the third auxiliary electrode 73 protrudes from the second auxiliary electrode 72 by a certain distance, diffusion performance of an organic emitting material in an evaporation mode is relatively poor, thus the "eave" structure of the third auxiliary electrode 73 may cut off the organic emitting material, so that not only the organic emitting material is disconnected at an edge of a side surface of the third auxiliary electrode 73 to form the light emitting block 80 on an upper surface of the third auxiliary electrode 73, but also the "eave" structure may prevent the organic emitting material from diffusing below the eave. The organic emitting material is formed on a portion of a surface of the first auxiliary electrode 71, and the organic emitting material is not evaporated on a surface of a region of the first auxiliary electrode 71 close to the second auxiliary electrode 72, thus achieving mutual isolation between the organic emitting layer 23 and the light emitting block 80.

In an exemplary implementation mode, an orthographic projection of the light emitting block 80 on the base substrate is within a range of an orthographic projection of the third auxiliary electrode 73 on the base substrate.

In an exemplary implementation mode, the organic emitting layer 23 located in a region of the first pixel opening K3 laps over the third anode 23-1, thus achieving a connection between the organic emitting layer 23 and the anode 21.

Figure 13:
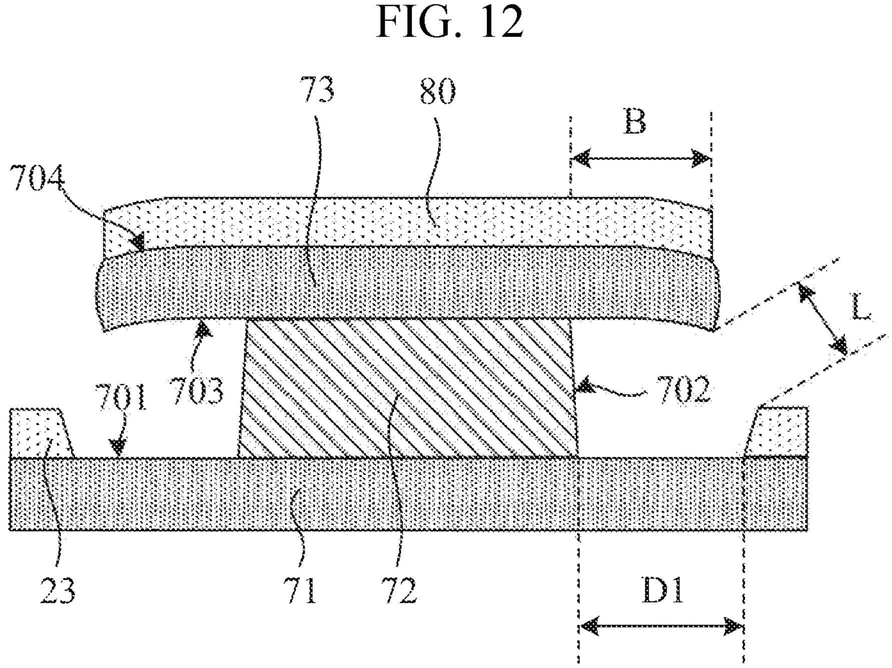
FIG. 13 is a schematic sectional view of an organic emitting layer and a light emitting block according to an embodiment of the present disclosure.

FIG. 13 is a schematic sectional view of an organic emitting layer and a light emitting block according to an embodiment of the present disclosure, and is an enlarged view of a region where an auxiliary electrode is located in FIG. 12. As shown in FIG. 13, on a plane perpendicular to the base substrate, the auxiliary electrode 70 has a plurality of exposed surfaces, these exposed surfaces at least include a first surface (an upper surface) 701 of the first auxiliary electrode 71 away from the base substrate, a second surface 702 of a sidewall of the second auxiliary electrode 72, a third surface (a lower surface) 703 of the third auxiliary electrode 73 on a side facing the base substrate, and a fourth surface (an upper surface) 704 of the third auxiliary Electrode 73 on a side away from the base substrate. In an exemplary implementation mode, a side surface refers to a surface of which a normal direction is parallel or approximatively parallel to a plane of the base substrate. For example, on a plane parallel to the base substrate, a side surface 411 of the second auxiliary electrode 72 includes a plurality of surfaces in a circumferential direction.

In an exemplary implementation mode, the light emitting block 80 may be disposed on the fourth surface 704 of the third auxiliary electrode 73, and the third surface 703 of the third auxiliary Electrode 73 and the second surface 702 of the second auxiliary electrode 72 do not lap over the organic emitting layer 23 or the light emitting block 80.

In an exemplary implementation mode, the organic emitting layer 23 may extend to a region where the auxiliary electrode opening K4 is located, to cover a sidewall of the auxiliary electrode opening K4 on the one hand, and cover a portion of the first surface 701 of the first auxiliary electrode 71 on the other hand.

In an exemplary implementation mode, the organic emitting layer 23 laps over the first surface 701, and there is a first lapping distance D1 between an edge of the organic emitting layer 23 on a side close to the second auxiliary electrode 72 and the sidewall of the second auxiliary electrode 72, and the first lapping distance D1 is configured so that a subsequently formed cathode laps over the first surface 701.

In an exemplary implementation mode, the first lapping distance D1 may be greater than the protruding distance B. In the present disclosure, a dimensional relationship between the first lapping distance D1 and the protruding distance B is set, the first lapping distance D1 is larger than the protruding distance B, so that space where a protruding portion of the third auxiliary electrode 73 and the sidewall of the second auxiliary electrode 72 form an inwardly recessed structure may be enlarged, which is beneficial to diffusion of the subsequently formed cathode to the sidewall of the second auxiliary electrode 72 and achieving lapping between the cathode and the sidewall of the second auxiliary cathode.

In an exemplary implementation mode, a thickness of the organic emitting layer (light emitting block) may be about 0.5 to 1 times the protruding distance B, that is, the protruding distance B may be about 1 to 2 times the thickness of the organic emitting layer (light emitting block). In the present disclosure, a ratio of the thickness of the organic emitting layer to the protruding distance B is set such that a higher pressure may be prevented from being applied to the protruding portion due to a thicker light emitting block, it may be ensured that the protruding portion will not be broken in a case where the organic emitting layer is disconnected at an edge of a side surface of the protruding portion.

In an exemplary implementation mode, the thickness H of the second auxiliary electrode may be greater than the thickness of the organic emitting layer (light emitting block). In the present disclosure, a ratio of the thickness of the second auxiliary electrode to the thickness of the organic emitting layer is set such that a channel through which a material of the cathode diffuses to an inwardly recessed structure may be prevented from being blocked due to a thicker organic emitting layer, it may be ensured that a subsequently formed cathode material may diffuse to the inwardly recessed structure, and lapping between the cathode and the sidewall of the second auxiliary cathode may be achieved.

In an exemplary implementation mode, within the auxiliary electrode opening K4, a minimum distance L between an edge of the organic emitting layer 23, located on the first surface 701, on a side close to the protruding portion and an edge of the protruding portion of the third auxiliary electrode 73 on a side close to the organic emitting layer 23 may be greater than a thickness of the third auxiliary electrode 73 (the protruding portion). Since the protruding portion of the third auxiliary electrode 73 is in a shape of an arc drooping towards the direction of the base substrate, a channel through which a material of the cathode diffuses to the inwardly recessed structure will be reduced. In the present disclosure, a minimum distance between the protruding portion and the organic emitting layer is set to be greater than a thickness of the protruding portion such that the protruding portion is prevented from breaking due to a relatively large drooping degree of the protruding portion, and the channel through which the material of the cathode diffuses to the inwardly recessed structure is also prevented from being blocked due to the relatively large drooping degree of the protruding portion, so as to ensure that the subsequently formed cathode material may diffuse to the inwardly recessed structure and to achieve lapping between the cathode and the sidewall of the second auxiliary cathode.

In an exemplary implementation mode, the organic emitting layer may include an Emitting Layer (EML) and any one or more of a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, the organic emitting layer may be formed by evaporation using a Fine Metal Mask (FMM) or an Open Mask, or through an inkjet process.

In an exemplary implementation mode, the organic emitting layer may be prepared using a following preparation method. First, a hole injection layer and a hole transport layer are sequentially evaporated using an open mask, and a common layer of the hole injection layer and the hole transport layer are formed on the display substrate. Then, using a fine metal mask, an electron block layer and a red emitting layer are evaporated in a red sub-pixel, an electron block layer and a green emitting layer are evaporated in a green sub-pixel, and an electron block layer and a blue emitting layer are evaporated in a blue sub-pixel. Electron block layers and emitting layers of adjacent sub-pixels may be overlapped slightly with each other (e.g., an overlapping portion accounts for less than 10% of an area of a pattern of a respective emitting layer), or may be isolated from each other. Then, a hole block layer, an electron transport layer, and an electron injection layer are sequentially evaporated using an open mask, and a common layer of the hole block layer, the electron transport layer, and the electron injection layer is formed on the display substrate.

In an exemplary implementation mode, the electron block layer may be used as a micro-cavity adjustment layer of a light emitting device. A thickness of the electron block layer is designed such that a thickness of the organic emitting layer between the cathode and the anode may satisfy a design of a length of a micro-cavity. In some exemplary implementation modes, the hole transport layer, the hole block layer, or the electron transport layer in the organic emitting layer may be used as a micro-cavity adjustment layer of a light emitting device, the present disclosure is not limited thereto.

In an exemplary implementation mode, the emitting layer may include a host material and a dopant material doped into the host material. A doping ratio of the dopant material of the emitting layer is 1% to 20%. Within a range of the doping ratio, on one hand, the host material of the emitting layer may effectively transfer exciton energy to the dopant material of the emitting layer to excite the dopant material of the emitting layer to emit light; on the other hand, the host material of the emitting layer "dilutes" the dopant material of the emitting layer, so as to effectively improve fluorescence quenching caused by collisions between molecules of the dopant material of the emitting layer and collisions between energies, and improve a light emitting efficiency and device lifetime. In an exemplary implementation mode, the doping ratio refers to a ratio of a mass of the dopant material to a mass of the emitting layer, that is, a mass percentage. In an exemplary implementation mode, the host material and the dopant material may be co-evaporated through a multi-source evaporation process, so that the host material and the dopant material are uniformly dispersed in the emitting layer. The doping ratio may be adjusted and controlled by controlling an evaporation rate of the dopant material or by controlling a ratio of an evaporation rate of the host material to an evaporation rate of the dopant material in an evaporation process. In an exemplary implementation mode, a thickness of the emitting layer may be about 10 nm to 50 nm.

In an exemplary implementation mode, the hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide, or may be made of a p-type dopant of a strong electron-withdrawing system and a dopant of a hole transport material. In an exemplary implementation mode, a thickness of the hole injection layer may be about 5 nm to 20 nm.

In an exemplary implementation mode, the hole transport layer may be made of a material with relatively high hole mobility, such as an aromatic amine compound, a substituent group of which may be carbazole, methylfluorene, spirofluorene, dibenzothiophene, or furan, etc. In an exemplary implementation mode, a thickness of the hole transport layer may be about 40 nm to 150 nm.

In an exemplary implementation mode, the hole block layer and the electron transport layer may be made of aromatic heterocyclic compounds, for example, imidazole derivatives such as benzimidazole derivatives, imidazopyridine derivatives, benzimidazole phenanthridine derivatives; azine derivatives such as pyrimidine derivatives, triazine derivatives; compounds containing nitrogen-containing six-membered ring structures (also including compounds having substituent groups of phosphine oxide system on heterocyclic rings) such as quinoline derivatives, isoquinoline derivatives, phenanthroline derivatives. In an exemplary implementation mode, a thickness of the hole block layer may be about 5 nm to 15 nm, and a thickness of the electron transport layer may be about 20 nm to 50 nm.

In an exemplary implementation mode, an electron injection layer may be made of an alkali metal or a metal, such as Lithium Fluoride (LiF), Ytterbium (Yb), Magnesium (Mg), or Calcium (Ca), or a compound of these alkali metals or metals. In an exemplary implementation mode, a thickness of the electron injection layer may be about 0.5 nm to 2 nm.

Figure 14:
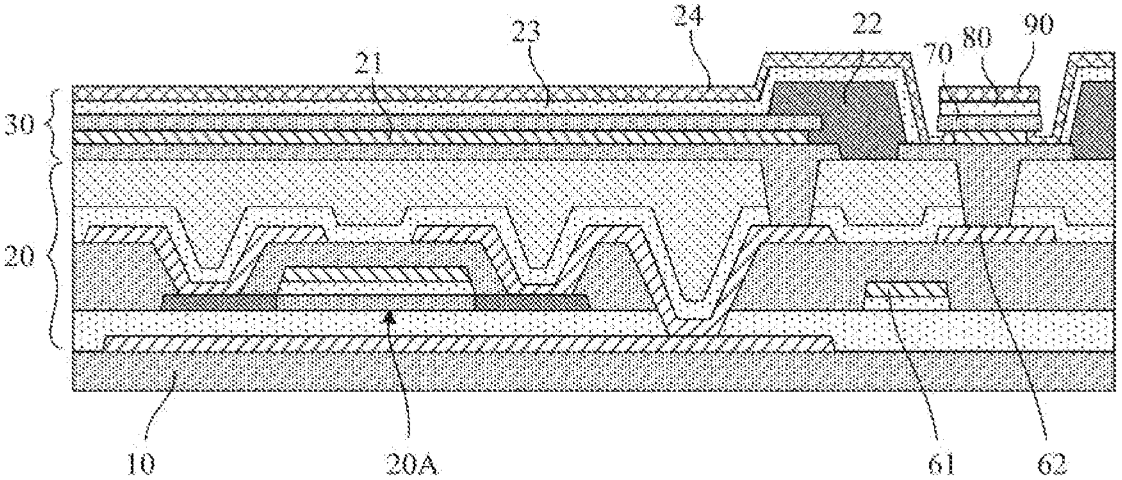
FIG. 14 is a schematic diagram after a pattern of a cathode is formed according to an embodiment of the present disclosure.

(7) A pattern of a cathode is formed. In an exemplary implementation mode, forming the pattern of the cathode may include: depositing a cathode thin film on the base substrate on which the aforementioned patterns are formed, to form patterns of the cathode 24 and the cathode block 90, wherein the cathode 24 is connected with the organic emitting layer 23 and the auxiliary electrode 70, the cathode block 90 is connected with the light emitting block 80, and the cathode 24 is isolated from the cathode block 90, as shown in FIG. 14.

In an exemplary implementation mode, in a region other than the auxiliary electrode 70, the cathode 24 may be a monolithic structure connected together, and the cathode 24 is disposed on the organic emitting layer 23. In a region where the auxiliary electrode 70 is located, the cathode 24 is connected with the first auxiliary electrode 71 and the second auxiliary electrode 72 of the auxiliary electrode 70.

In an exemplary implementation mode, the cathode block 90 is disposed on a surface of the light emitting block 80 on a side away from the base substrate, and an orthographic projection of the cathode block 90 on the base substrate may be within a range of an orthographic projection of the light emitting block 80 on the base substrate.

In an exemplary implementation mode, the cathode thin film may be made of transparent Indium Zinc Oxide (IZO), and may be deposited by means of magnetron sputtering. Since indium zinc oxide deposited by means of magnetron sputtering has good diffusion performance, the indium zinc oxide may diffuse below the eave by bypassing the "eave" structure of the third auxiliary electrode 73, the cathode 24 is formed on an exposed first surface 701 on one hand, and the cathode 24 may be formed on a portion or all of the second surface 702 on the other hand, so as to not only implement lapping between the cathode and the auxiliary electrode successfully, but also increase a contact area between the cathode and the auxiliary electrode effectively, thereby reducing a resistance at a contact interface effectively and improving connection reliability.

Figure 15:
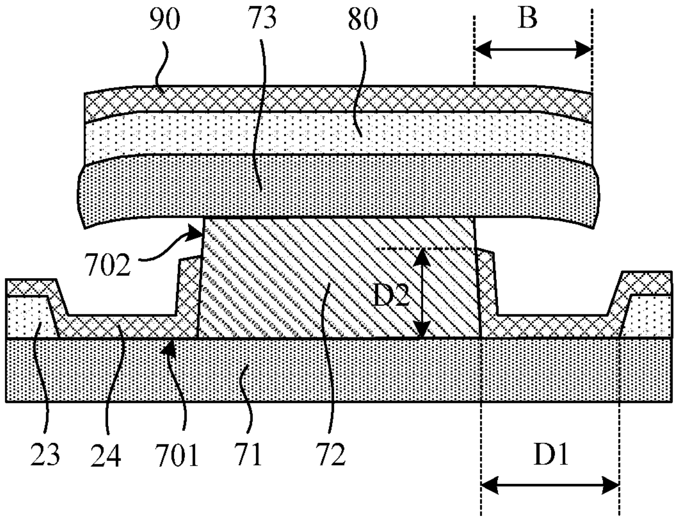
FIG. 15 is a schematic diagram of a connection between a cathode and an auxiliary electrode according to an embodiment of the present disclosure.

FIG. 15 is a schematic diagram of a connection between a cathode and an auxiliary electrode according to an embodiment of the present disclosure, which is an enlarged view of a region where the auxiliary electrode is located in FIG. 14. As shown in FIG. 15, the cathode 24 may lap over the first surface 701, at least a portion of the second surface 702, and one side of the organic emitting layer 23 away from the base substrate, respectively, thereby implementing a connection between the cathode 24 and the auxiliary electrode.

In an exemplary implementation mode, the cathode 24 may extend to a region where the auxiliary electrode opening K4 is located, to cover the organic emitting layer 23 on one hand, cover a portion of the first surface 701 of the first auxiliary electrode 71 on another hand, and cover a portion of the second surface 702 of the second auxiliary electrode 72 on yet another hand.

In an exemplary implementation mode, within a region where the auxiliary electrode opening is located, there is a first lapping distance D1 between the cathode 24 and the first surface 701 of the first auxiliary electrode 71, and the first lapping distance D1 may be greater than the protruding distance B. In the present disclosure, a dimensional relationship between the first lapping distance D1 and the protruding distance B is set, which is beneficial for the cathode to diffuse to the sidewall of the second auxiliary cathode, so as to implement lapping between the cathode and the sidewall of the second auxiliary cathode.

In an exemplary implementation mode, within a region where the auxiliary electrode opening is located, there is a second lapping distance D2 between the cathode 24 and the second surface 702 of the second auxiliary electrode 72, and the second lapping distance D2 may be less than the protruding distance B.

In an exemplary implementation mode, the light emitting block 80 may be disposed on the fourth surface 704, and the cathode block 90 may be disposed on one side of the light emitting block 80 away from the base substrate.

In an exemplary implementation mode, a thickness of the cathode 24 (a cathode block 90) may be less than a thickness of the third auxiliary electrode 73, i.e., a thickness of the protruding portion may be greater than a thickness of the cathode block.

In an exemplary implementation mode, the cathode 24 may be made of any one or more of Magnesium (Mg), Argentum (Ag), Aluminum (Al), Copper (Cu), and Lithium (Li), or an alloy made of any one or more of the above metals. A thickness of the cathode 24 may be about 100 nm to 300 nm.

In some possible exemplary implementation modes, a pattern of an optical coupling layer may be formed after a pattern of a cathode is formed. The optical coupling layer is disposed on the cathode. A refractive index of the optical coupling layer may be greater than a refractive index of the cathode, which is beneficial to light extraction and increasing a light extraction efficiency. The optical coupling layer may be made of an organic material, or made of an inorganic material, or made of an organic material and an inorganic material, and may be a single layer, a multi-layer, or a composite layer, the present disclosure is not limited thereto.

So far, preparation of a pattern of the light emitting structure layer 30 is completed on the drive structure layer 20. The light emitting structure layer 30 may include the anode 21, the pixel definition layer 22, the organic emitting layer 23, the cathode 24, and the auxiliary electrode 70. The organic emitting layer 23 is connected with the anode 21 and the cathode 24, respectively, and the cathode 24 is connected with the auxiliary electrode 70.

Figure 16:
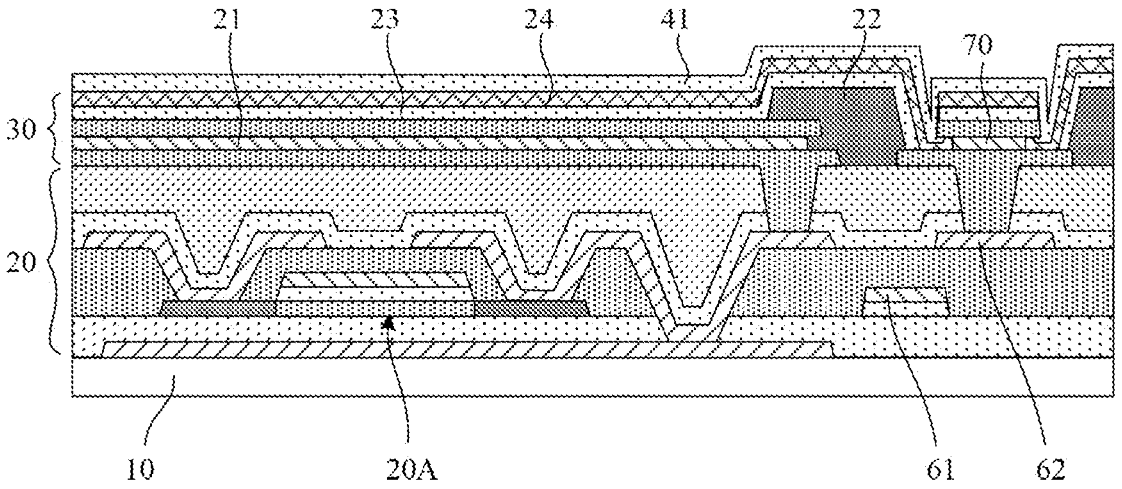
FIG. 16 and FIG. 17 are schematic diagrams after a pattern of a first encapsulation layer is formed according to an embodiment of the present disclosure.
Figure 17:
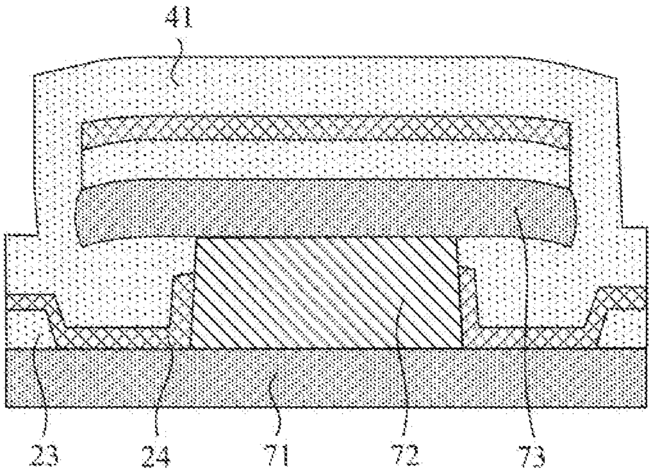

(8) A pattern of a first encapsulation layer is formed. In an exemplary implementation mode, forming the pattern of the first encapsulation layer may include: depositing a first encapsulation thin film using a deposition method to form a pattern of the first encapsulation layer 41. The first encapsulation layer 41 covers the cathode 24 in a region other than the auxiliary electrode 70, and the first encapsulation layer 41 wraps the auxiliary electrode 70 in a region where the auxiliary electrode 70 is located, as shown in FIG. 16 and FIG. 17. FIG. 17 is a schematic diagram of the auxiliary electrode wrapped by the first encapsulation layer in FIG. 16.

In an exemplary implementation mode, the first encapsulation layer 41 wrapping the auxiliary electrode 70 means that the first encapsulation layer 41 covers an entire exposed surface of the auxiliary electrode 70, that is, the first encapsulation layer 41 covers a cathode block and a light emitting block located on one side of the auxiliary electrode 70 away from the base substrate, covers an inner surface of the auxiliary electrode 70 facing a display region 100, covers a side surface of the auxiliary electrode 70, and covers a cathode lapping over the auxiliary electrode 70, to form a complete wrap of the auxiliary electrode 70 by the first encapsulation layer 41. In the exemplary embodiment of the present disclosure, a region where the auxiliary electrode 70 is located is completely wrapped by the first encapsulation layer, so that a transport channel of water and oxygen may be cut off, thereby blocking invasion of water and oxygen effectively, and guaranteeing encapsulation effectiveness and reliability.

In an exemplary implementation mode, a ratio of a thickness of the third auxiliary electrode (the protruding portion) to a thickness of the organic emitting layer (the light emitting block) has a first ratio, and a ratio of a thickness of the second auxiliary electrode (a thickness of the second auxiliary electrode) to a thickness of the first encapsulation layer has a second ratio. The first ratio may be greater than the second ratio. A size of the first ratio may reflect a drooping degree of the protruding portion. The smaller the first ratio is, the greater the drooping degree of the protruding portion is; the greater the first ratio is, the smaller the drooping degree of the protruding portion is. A size of the second ratio may reflect an effect of wrapping the auxiliary electrode by the first encapsulation layer. The smaller the second ratio is, the worse the effect of wrapping the auxiliary electrode by the first encapsulation layer is; the greater the second ratio is, the better the effect of wrapping the auxiliary electrode by the first encapsulation layer is. In the present disclosure, a relationship between the drooping degree of the protruding portion and an ability of the first encapsulation layer to wrap the auxiliary electrode is set such that encapsulation effectiveness and reliability may be guaranteed on a premise of guaranteeing working reliability of the auxiliary electrode.

In an exemplary implementation mode, the preparation process of the display substrate may further include: inkjet printing an organic material on a first encapsulation layer using an inkjet printing process, to form a second encapsulation layer after the organic material is cured to form a film, and then depositing a second inorganic thin film using an open mask to form a third encapsulation layer, wherein the first encapsulation layer, the second encapsulation layer, and the third encapsulation layer form an encapsulation layer. In an exemplary embodiment, the first encapsulation layer and the third encapsulation layer may be made of any one or more of Silicon Oxide (SiOx), Silicon Nitride (SiNx), and Silicon Oxynitride (SiON), and may be a single layer, a multi-layer, or a composite layer, and the second encapsulation layer may be made of a resin material, and form a stacked structure of an inorganic material/an organic material/an inorganic material. An organic material layer is disposed between two inorganic material layers, which may ensure that external water vapor cannot enter a light emitting structure layer.

In an exemplary implementation mode, after preparation of an encapsulation structure layer is completed, a Touch Structure layer (TSP) may be formed on the encapsulation structure layer. The touch structure layer may include a touch electrode layer, or include a touch electrode layer and a touch insulation layer, and the present disclosure is not limited thereto.

In an exemplary implementation mode, when a flexible display substrate is prepared, a preparation process of the display substrate may include processes such as peeling a glass carrier board, attaching a back film, and cutting, the present disclosure is not limited thereto.

It may be seen from a structure of the display substrate and the preparation process thereof according to the exemplary embodiments of the present disclosure that in an exemplary embodiment of the present disclosure, an auxiliary electrode is set and a cathode is connected with the auxiliary electrode, a cathode voltage drop may be effectively decreased. In the present disclosure, a cross section of the auxiliary electrode is set to be in a shape of a Chinese character "工", so that an organic emitting layer and the cathode are broken off at an edge of the auxiliary electrode, and the cathode is deposited by means of magnetron sputtering, so as to not only successfully implement lapping between the cathode and the auxiliary electrode, but also effectively increase a contact area between the cathode and the auxiliary electrode, thereby effectively reducing a resistance at a contact interface and improving connection reliability. In an exemplary embodiment of the present disclosure, a relationship between a protruding distance and a thickness of a second auxiliary electrode is set, an optimal lapping structure between the cathode and the "工"-shaped auxiliary electrode may be achieved, thereby improving a production efficiency and a product yield, and improving display quality. In an exemplary embodiment of the present disclosure, a power supply electrode, and a source electrode and a drain electrode of a transistor are disposed in a same layer, and an auxiliary electrode and an anode are disposed in a same layer, the auxiliary electrode is located on one side of an organic emitting layer close to a display substrate, so that not only process flows are effectively reduced and a production cost is decreased, but also light emitting efficacy will not be affected adversely, which is beneficial to improving encapsulation reliability. The preparation method of the display substrate according to the exemplary embodiment of the present disclosure has good process compatibility, simple process realization, easy implementation, a high production efficiency, a low production cost, and a high yield.

The structure of the display substrate and the preparation process thereof according to the exemplary embodiments of the present disclosure are described by way of example only. In an exemplary implementation mode, corresponding structures may be changed and patterning processes may be added or reduced according to actual needs, the present disclosure is not limited thereto.

In an exemplary implementation mode, the display substrate according to the present disclosure may be applied to a display apparatus with a pixel drive circuit, such as an OLED, a quantum dot display (QLED), a light emitting diode display (Micro LED or Mini LED), or a Quantum Dot Light Emitting Diode display (QDLED), etc., the present disclosure is not limited thereto.

The present disclosure also provides a display apparatus which includes the display substrate according to the aforementioned embodiments. The display apparatus may be any product or component with a display function, such as a mobile phone, a tablet computer, a television, a display, a notebook computer, a digital photo frame, or a navigator.

Although the implementation modes disclosed in the present disclosure are as above, the contents described are only implementation modes adopted for convenience of understanding the present disclosure, and are not used for limiting the present disclosure. Any skilled person in the art to which the present disclosure pertains may make any modification and alteration in forms and details of implementation without departing from the spirit and scope of the present disclosure. However, the scope of patent protection of the present disclosure should be subject to the scope defined by the appended claims.

The invention claimed is:

1. A display substrate, comprising a drive structure layer disposed on a base substrate and a light emitting structure layer disposed on one side of the drive structure layer away from the base substrate, wherein the light emitting structure layer at least comprises a cathode and an auxiliary electrode, and the cathode is connected with the auxiliary electrode; the auxiliary electrode comprises a first auxiliary electrode, a second auxiliary electrode, and a third auxiliary electrode stacked along a direction away from the base substrate, the third auxiliary electrode has a protruding portion relative to a sidewall of the second auxiliary electrode, and the protruding portion and the sidewall of the second auxiliary electrode form an inwardly recessed structure, a protruding distance of the protruding portion is greater than or equal to a thickness of the second auxiliary electrode, and the protruding distance is a distance between an edge of the third auxiliary electrode and the sidewall of the second auxiliary electrode, wherein the light emitting structure layer further comprises an organic emitting layer, wherein the protruding portion is in a shape of an arc drooping towards a direction of the base substrate, and a minimum distance between an edge of the protruding portion on a side close to the organic emitting layer and an edge of the organic emitting layer on a side close to the protruding portion is greater than a thickness of the third auxiliary electrode, wherein a distance between an edge of the third auxiliary electrode closest to the base substrate and the base substrate is less than a distance between a surface of the second auxiliary electrode away from the base substrate and the base substrate, and wherein two edges of the protruding portion in a direction parallel to the base substrate are in a shape of an arc.

2. The display substrate according to claim 1, wherein the protruding distance is 1.0 to 2.5 times the thickness of the second auxiliary electrode.

3. The display substrate according to claim 1, wherein a thickness of the third auxiliary electrode is greater than a thickness of the cathode.

4. The display substrate according to claim 1, wherein the organic emitting layer is connected with the cathode, and the protruding distance is 1 to 2 times a thickness of the organic emitting layer.

5. The display substrate according to claim 4, wherein the thickness of the second auxiliary electrode is greater than the thickness of the organic emitting layer.

6. The display substrate according to claim 4, wherein the display substrate further comprises a first encapsulation layer disposed on one side of the light emitting structure layer away from the base substrate, the first encapsulation layer wraps the auxiliary electrode, a ratio of a thickness of the third auxiliary electrode to the thickness of the organic emitting layer has a first ratio, and a ratio of the thickness of the second auxiliary electrode to a thickness of the first encapsulation layer has a second ratio, and the first ratio is greater than the second ratio.

7. The display substrate according to claim 1, wherein on a plane parallel to the base substrate, a width of the second auxiliary electrode is less than a width of the first auxiliary electrode, and an orthographic projection of the second auxiliary electrode on the base substrate is within a range of an orthographic projection of the first auxiliary electrode on the base substrate; the width of the second auxiliary electrode is less than a width of the third auxiliary electrode, and the orthographic projection of the second auxiliary electrode on the base substrate is within a range of an orthographic projection of the third auxiliary electrode on the base substrate; the width of the third auxiliary electrode is less than the width of the first auxiliary electrode, and the orthographic projection of the third auxiliary electrode on the base substrate is within the range of the orthographic projection of the first auxiliary electrode on the base substrate.

8. The display substrate according to claim 1, wherein on a plane perpendicular to the display substrate, a cross section of the second auxiliary electrode is in a shape of a trapezoid.

9. The display substrate according to claim 1, wherein the drive structure layer comprises a first conductive layer, a first insulation layer, a semiconductor layer, a second insulation layer, a second conductive layer, a third insulation layer, a third conductive layer, a fourth insulation layer, and a planarization layer disposed sequentially on the base substrate, the first conductive layer at least comprises a barrier electrode, the semiconductor layer at least comprises an active layer, the second conductive layer at least comprises a gate electrode, the third conductive layer at least comprises a source electrode, a drain electrode, and a power supply electrode, and the first auxiliary electrode in the auxiliary electrode is connected with the power supply electrode through a via.

10. The display substrate according to claim 1, wherein the light emitting structure layer further comprises an anode, the anode comprises a first anode, a second anode, and a third anode stacked along the direction away from the base substrate, an orthographic projection of the second anode on the base substrate is within a range of an orthographic projection of the first anode on the base substrate, and the orthographic projection of the second anode on the base substrate is within a range of an orthographic projection of the third anode on the base substrate.

11. The display substrate according to claim 10, wherein the first auxiliary electrode and the first anode are disposed in a same layer and are made of a same material; the second auxiliary electrode and the second anode are disposed in a same layer and are made of a same material; the third auxiliary electrode and the third anode are disposed in a same layer and are made of a same material.

12. The display substrate according to claim 10, wherein the light emitting structure layer further comprises a pixel definition layer, a pixel opening and an auxiliary electrode opening are provided on the pixel definition layer, the pixel opening exposes a surface of the third anode in the anode, and the auxiliary electrode opening exposes a whole surface of the third auxiliary electrode and a portion of a surface of the first auxiliary electrode in the auxiliary electrode.

13. The display substrate according to claim 12, wherein orthographic projections of the second auxiliary electrode and the third auxiliary electrode on the base substrate are within a range of an orthographic projection of the auxiliary electrode opening on the base substrate.

14. The display substrate according to claim 12, wherein within the auxiliary electrode opening, the cathode laps over a surface of the first auxiliary electrode on a side away from the base substrate.

15. The display substrate according to claim 14, wherein there is a first lapping distance between the cathode and the surface of the first auxiliary electrode on the side away from the base substrate, and the protruding distance is less than the first lapping distance.

16. The display substrate according to claim 15, wherein the organic emitting layer laps over the surface of the first auxiliary electrode on the side away from the base substrate, and there is the first lapping distance between an edge of the organic emitting layer close to the second auxiliary electrode and the sidewall of the second auxiliary electrode.

17. The display substrate according to claim 12, wherein within the auxiliary electrode opening, the cathode laps over the sidewall of the second auxiliary electrode.

18. The display substrate according to claim 10, wherein the light emitting structure layer further comprises a light emitting block, and a cathode block, the organic emitting layer is connected with the third anode, the cathode is connected with the organic emitting layer, the light emitting block is disposed on a surface of the third auxiliary electrode on a side away from the base substrate, the light emitting block and the organic emitting layer are isolated from each other, the cathode block is disposed on a surface of the light emitting block on a side away from the base substrate, and the cathode block and the cathode are isolated from each other.

19. A display apparatus, comprising the display substrate according to claim 1.

* * * * *